(12) United States Patent
Morinaga

(10) Patent No.: US 10,921,669 B2
(45) Date of Patent: Feb. 16, 2021

(54) DISPLAY DEVICE AND ACTIVE MATRIX SUBSTRATE

(71) Applicant: Sharp Kabushiki Kaisha, Osaka (JP)

(72) Inventor: Junichi Morinaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/740,710

(22) Filed: Jan. 13, 2020

(65) Prior Publication Data

US 2020/0233275 A1    Jul. 23, 2020

Related U.S. Application Data

(60) Provisional application No. 62/793,982, filed on Jan. 18, 2019.

(51) Int. Cl.
    *G02F 1/1362*   (2006.01)
    *G02F 1/1368*   (2006.01)
    *G02F 1/1339*   (2006.01)
    *G02F 1/1337*   (2006.01)

(52) U.S. Cl.
    CPC ...... *G02F 1/136286* (2013.01); *G02F 1/1368* (2013.01); *G02F 1/13394* (2013.01); *G02F 1/133784* (2013.01); *G02F 1/136209* (2013.01); *G02F 2201/40* (2013.01)

(58) Field of Classification Search
    CPC ............. G02F 1/136286; G02F 1/1368; G02F 1/13394; G02F 1/136209; G02F 1/133784; G02F 2201/40

USPC .................. 349/110–111, 139, 155–156
See application file for complete search history.

(56) References Cited

U.S. PATENT DOCUMENTS

| | | | |
|---|---|---|---|
| 2008/0035920 A1 | 2/2008 | Takechi et al. | |
| 2012/0138922 A1 | 6/2012 | Yamazaki et al. | |
| 2013/0320334 A1 | 12/2013 | Yamazaki et al. | |
| 2014/0286076 A1 | 9/2014 | Aoki et al. | |
| 2019/0339556 A1* | 11/2019 | Yoshida | G02F 1/136286 |

FOREIGN PATENT DOCUMENTS

| | | | |
|---|---|---|---|
| JP | 2008-040343 A | 2/2008 | |
| JP | 2012-134475 A | 7/2012 | |
| JP | 2014-007399 A | 1/2014 | |
| JP | 2014-209727 A | 11/2014 | |
| JP | 2015-004808 A | 1/2015 | |

* cited by examiner

*Primary Examiner* — Charles S Chang

(74) *Attorney, Agent, or Firm* — Keating & Bennett, LLP

(57) ABSTRACT

A display device includes a first source wiring line having a first wide width portion with a second width greater than the first width. The first wide width portion is disposed in a vicinity of one of spacers. The first wide width portion includes an overlapping region overlapping with a black matrix and a non-overlapping region not overlapping with the black matrix when seen in a normal line direction of a main surface of a substrate. A spacer shadow region extending from one spacer to a side of a first direction with an identical width with a width of the one spacer includes a first region overlapping with the black matrix and a second region not overlapping with the black matrix when seen in the normal line direction. The non-overlapping region of the first wide width portion partially overlaps with the second region of the spacer shadow region.

20 Claims, 15 Drawing Sheets

DISPLAY DEVICE AND ACTIVE MATRIX SUBSTRATE

TECHNICAL FIELD

The present invention relates to a display device and an active matrix substrate.

BACKGROUND ART

Display devices that include active matrix substrates provided with switching elements for the respective pixels have widely been used. The active matrix substrates that include thin film transistors (hereinafter, referred to as "TFTs") as switching elements are called TFT substrates. Note that in the specification, portions of the TFT substrates corresponding to the pixels in the display devices are called pixel regions or pixels. The TFTs provided as switching elements for the respective pixels in the active matrix substrates are called "pixel TFTs".

In recent years, utilization of oxide semiconductors instead of amorphous silicon or polycrystalline silicon as materials for active layers of TFTs has been proposed. Such TFTs are referred to as "oxide semiconductor TFTs". The oxide semiconductors have higher mobility than that of amorphous silicon. Therefore, the oxide semiconductor TFTs can operate at higher speeds than amorphous silicon TFTs do. Also, since oxide semiconductor films are formed in a simpler process than that for polycrystalline silicon films, it is also possible to apply the oxide semiconductor films to devices that require large areas.

A liquid crystal display device is configured by sandwiching a liquid crystal layer between an active matrix substrate and a counter substrate. Alignment films are formed both on the side of the active matrix substrate and on the side of the counter substrate of the liquid crystal layer such that the alignment films come into contact with the liquid crystal layer. The alignment films restrict an initial alignment of liquid crystal molecules in the liquid crystal layer (the alignment of the liquid crystal molecules in a state in which no electric field is applied to the liquid crystal layer). Alignment processing of defining an initial alignment azimuth axis of the liquid crystal molecules is performed on the alignment films. Representative examples of the alignment processing include rubbing processing and light alignment processing.

Also, between the active matrix substrate and the counter substrate, a columnar spacer for defining an interval (cell gap) between these substrates is disposed. The alignment processing is performed on the alignment film that is formed so as to cover the spacer for the substrate on which the spacer is disposed. Therefore, the fact is known that an alignment restricting force in regions above and in the surroundings of the spacer in the alignment film is lower than that in the other regions and an alignment failure of liquid crystal molecules may occur. In this specification, the region in which an alignment failure may occur due to the spacer will be referred to as an "alignment failure region". For example, PTL 1 proposes that the position and the shape of a spacer are adjusted such that the alignment failure region due to the spacer is shielded from light with a black matrix in a display device provided with an alignment film on which light alignment processing has been performed.

CITATION LIST

Patent Literature

[PTL 1] Japanese Unexamined Patent Application Publication No. 2015-4808

SUMMARY OF INVENTION

Technical Problem

As a result of intensive studies of the present inventor, there are cases in which it is difficult to sufficiently shield the alignment failure region caused due to the spacer from light using the black matrix depending on an alignment processing method. In a case in which rubbing processing is performed on the alignment film, in particular, it is difficult to curb reduction of a pixel aperture ratio and to curb disadvantages such as light leakage due to the alignment failure region. Details will be described later.

An object of an embodiment of the invention is to provide a display device or an active matrix substrate capable of curbing degradation of display properties due to spacers.

Solution to Problem

The present specification discloses a display device and an active matrix substrate described in the following items.

[Item 1]

A display device including: a plurality of pixel regions; an active matrix substrate; a counter substrate that faces the active matrix substrate; and a liquid crystal layer disposed between the active matrix substrate and the counter substrate, in which the active matrix substrate has a substrate, a plurality of pixel TFTs that are supported on a main surface of the substrate and are provided such that each of the pixel TFTs corresponds to one of the plurality of pixel regions, a plurality of gate wiring lines that supply a gate signal to the plurality of pixel TFTs, and a plurality of source wiring lines that supply a source signal to the plurality of pixel TFTs, extend in a direction that intersects with the plurality of gate wiring lines, and have a first width, one of the active matrix substrate and the counter substrate includes an alignment film, which is disposed in contact with the liquid crystal layer and defines an initial alignment axis azimuth of liquid crystal molecules in the liquid crystal layer, on which rubbing processing is performed in a first direction that is parallel to the initial alignment axis azimuth, and a plurality of spacers that are disposed between the active matrix substrate and the counter substrate and define an interval between the active matrix substrate and the counter substrate, the display device further includes a black matrix that includes a plurality of gate wiring line light shielding portions and a plurality of source wiring line light shielding portions, each of the plurality of gate wiring line light shielding portions extends to be parallel to corresponding one of the plurality of gate wiring lines, each of the plurality of source wiring line light shielding portions extends to be parallel to corresponding one of the plurality of source wiring lines, when seen in a normal line direction of the main surface of the substrate, and the plurality of pixel regions include a first pixel region and a second pixel region that are adjacent to each other, and the plurality of source wiring lines include a first source wiring line located between the first pixel region and the second pixel region, and between the first pixel region and the second pixel region, the first source wiring line has a first wide width portion with a second width that is greater than the first width, the first wide width portion being disposed in a vicinity of one of the plurality of spacers, the first wide width portion including an overlapping region that overlaps with the black matrix and a non-overlapping region that does not overlap with the black matrix when seen in the normal line direction of the main surface of the substrate, and a spacer shadow region extending from the one spacer to a side of the first direction with an identical width with a width of the one spacer includes a first region that overlaps with the black matrix and a second region that does not overlap with the black matrix when seen in the normal line direction of the main surface of the substrate, and the non-overlapping region of the first wide width portion at least partially overlaps with the second region of the spacer shadow region.

[Item 2]

The display device according to Item 1, in which the first source wiring line forms an angle of equal to or greater than 2° and equal to or less than 30° with respect to the first direction between the first pixel region and the second pixel region.

[Item 3]

The display device according to Item 1 or 2, in which the first wide width portion is asymmetric with respect to a center line of the first source wiring line when seen in the normal line direction of the main surface of the substrate.

[Item 4]

The display device according to any one of Items 1 to 3, in which the center line of the first source wiring line extends across the spacer shadow region, and a part of the spacer shadow region located on a first side of the center line is greater than a part located on a second side when seen in the normal line direction of the main surface of the substrate.

[Item 5]

The display device according to Item 4, in which a part of the first wide width portion located on the first side of the center line is greater than a part located on the second side when seen in the normal line direction of the main surface of the substrate.

[Item 6]

The display device according to Item 4 or 5, in which the non-overlapping region of the first wide width portion is located only on the first side of the first source wiring line when seen in the normal line direction of the main surface of the substrate.

[Item 7]

The display device according to Item 4 or 5, in which the non-overlapping region of the first wide width portion is located on both sides of the first source wiring line, and a first part, of the non-overlapping region, located on the first side of the first source wiring line is greater than a second part located on the second side of the first source wiring line when seen in the normal line direction of the main surface of the substrate.

[Item 8]

The display device according to any one of Items 1 to 7, in which the first wide width portion and a semiconductor layer of each of the pixel TFTs overlap with each other with an insulating layer interposed between the first wide width portion and the semiconductor layer, and a part of the first wide width portion and a part of the semiconductor layer are in contact with each other in a contact hole formed in the insulating layer.

[Item 9]

The display device according to Item 8, in which the first wide width portion includes a contact part including a region that is in contact with the semiconductor layer and an expanded part that extends from the contact part to the side of the first direction with a smaller width than a width of the contact part, and at least a part of the expanded part does not overlap with the black matrix and overlaps with the spacer shadow region when seen in the normal line direction of the main surface of the substrate.

[Item 10]

The display device according to any one of Items 1 to 9, in which the plurality of pixel regions further include a third pixel region and a fourth pixel region that are adjacent to each other, at least one of the third pixel region and the fourth pixel region is different from the first pixel region and the second pixel region, the plurality of source wiring lines include a second source wiring line located between the third pixel region and the fourth pixel region, the second source wiring line further includes a second wide width portion with a wider width than the first width between the third pixel region and the fourth pixel region, and the second wide width portion entirely overlaps with the black matrix, or a region of the second wide width portion that does not overlap with the black matrix is smaller than the non-overlapping region of the first wide width portion when seen in the normal line direction of the main surface of the substrate.

[Item 11]

The display device according to Item 10, in which no spacer is disposed in a vicinity of the second wide width portion and on a side of the second wide width portion opposite to the first direction, the first wide width portion is asymmetric with respect to a center line of the first source wiring line, and the second wide width portion is symmetric with respect to a center line of the second source wiring line.

[Item 12]

The display device according to Item 10 or 11, in which the first wide width portion has an edge portion extending in the first direction, and the second wide width portion has an edge portion extending parallel to the second source wiring line.

[Item 13]

The display device according to any one of Items 10 to 12, in which a length of the first wide width portion in the first direction is greater than a length of the second wide width portion in the first direction.

[Item 14]

The display device according to any one of Items 1 to 13, in which the pixel TFTs include semiconductor layers and gate electrodes disposed above the semiconductor layers.

[Item 15]

The display device according to Item 14, in which the plurality of source wiring lines are disposed in the semiconductor layers of the pixel TFTs on a side of the substrate.

[Item 16]

The display device according to Item 15, in which the pixel TFTs further include other gate electrodes or light shielding films in the semiconductor layers on the side of the substrate, and the other gate electrodes or the light shielding films are formed of conductive films that are the same as the plurality of source wiring lines.

[Item 17]

The display device according to any one of Items 1 to 13, in which the pixel TFTs have semiconductor layers and gate electrodes disposed in the semiconductor layers on a side of the substrate.

[Item 18]

The display device according to any one of Items 1 to 17, in which the plurality of spacers and the alignment film are disposed on the active matrix substrate.

[Item 19]

The display device according to any one of Items 1 to 17, in which the plurality of spacers and the alignment film are provided on the counter substrate.

[Item 20]

The display device according to any one of Items 1 to 19, in which the pixel TFTs include oxide semiconductor layers that have channel regions.

[Item 21]

The display device according to Item 20, in which the oxide semiconductor layers contain In—Ga—Zn—O-based semiconductors.

[Item 22]

The display device according to Item 21, in which the In—Ga—Zn—O-based semiconductors contain crystalline parts.

[Item 23]

An active matrix substrate that has a plurality of pixel regions, the active matrix substrate including: a substrate; a plurality of pixel TFTs that are supported on a main surface of the substrate and are provided such that each of the pixel TFTs corresponds to one of the plurality of pixel regions; a plurality of gate wiring lines that supply a gate signal to the plurality of pixel TFTs; a plurality of source wiring lines that supply a source signal to the plurality of pixel TFTs, extend in a direction that intersects with the plurality of gate wiring lines, and have a first width; an alignment film, which defines an initial alignment axis azimuth of liquid crystal molecules, on which rubbing processing is performed in a first direction that is parallel to the initial alignment axis azimuth; and a plurality of spacers, in which the plurality of pixel regions include a first pixel region and a second pixel region that are adjacent to each other, and the plurality of source wiring lines include a first source wiring line located between the first pixel region and the second pixel region, between the first pixel region and the second pixel region, the first source wiring line has a first wide width portion with a second width that is greater than the first width, the first wide width portion being disposed in a vicinity of one of the plurality of spacers, the first wide width portion is asymmetric with respect to a center line of the first source wiring line when seen in a normal line direction of the main surface of the substrate, and a part of the first wide width portion overlaps with a spacer shadow region extending from the one spacer to a side of the first direction with an identical width with a width of the one spacer.

[Item 24]

The active matrix substrate according to Item 23, in which the center line of the first source wiring line extends across the spacer shadow region, and a part of the spacer shadow region located on a first side of the center line is greater than a part located on a second side, when seen in the normal line direction of the main surface of the substrate, and a part of the first wide width portion located on the first side of the center line is greater than a part located on the second side when seen in the normal line direction of the main surface of the substrate.

[Item 25]

The active matrix substrate according to Item 24, in which the first wide width portion and a semiconductor layer of each of the pixel TFTs overlap with each other with an insulating layer interposed between the first wide width portion and the semiconductor layer, a part of the first wide width portion and a part of the semiconductor layer are in contact with each other in a contact hole formed in the insulating layer, the first wide width portion includes a contact part including a region that is in contact with the semiconductor layer and an expanded part that extends from the contact part to the side of the first direction with a smaller width than a width of the contact part, and the expanded portion is larger on the first side of the center line than on the second side.

[Item 26]

The active matrix substrate according to Item 24 or 25, in which the plurality of pixel regions further include a third pixel region and a fourth pixel region that are adjacent to each other, at least one of the third pixel region and the fourth pixel region is different from the first pixel region and the second pixel region, the plurality of source wiring lines include a second source wiring line located between the third pixel region and the fourth pixel region, the second source wiring line further includes a second wide width portion with a wider width than the first width between the third pixel region and the fourth pixel region, no spacer is disposed in a vicinity of the second wide width portion and on a side of the second wide width portion opposite to the first direction, and the second wide width portion is symmetric with respect to a center line of the second source wiring line.

Advantageous Effects of Invention

According to an embodiment of the invention, a display device or an active matrix substrate capable of curbing degradation of display properties due to spacers is provided.

DESCRIPTION OF EMBODIMENTS

First, finding that the present inventor has discovered in regard to an alignment failure region that may be generated when an alignment film on which rubbing processing has been performed is used will be described with reference to drawings.

Figure 11A:
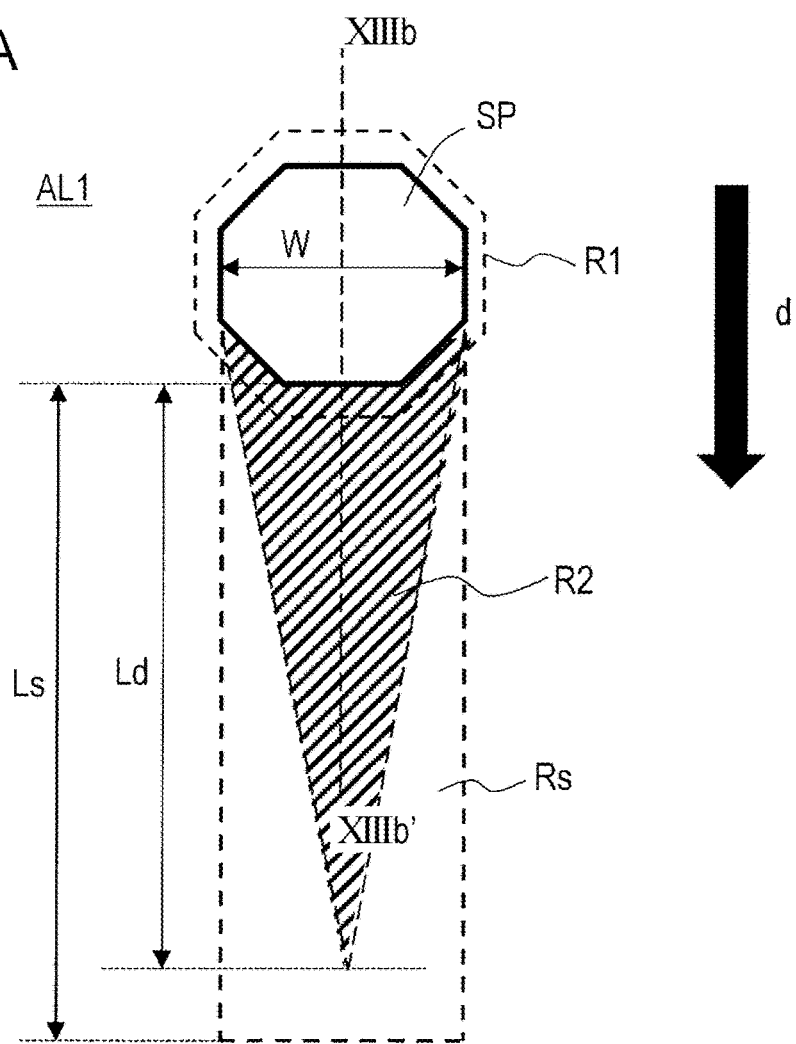
FIG. 11A is a schematic plan view for explaining an alignment failure region due to a spacer.
Figure 11B:
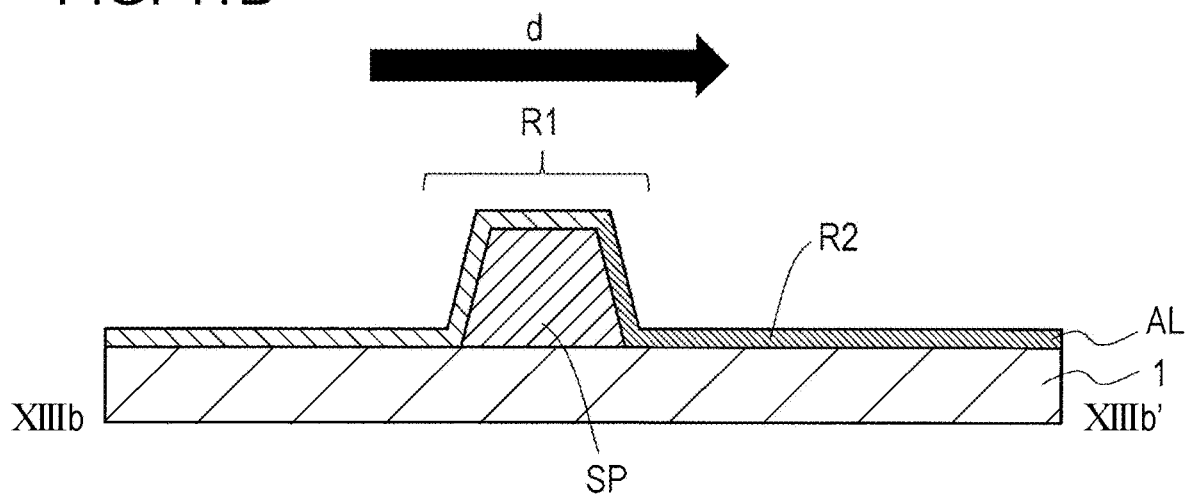
FIG. 11B is a schematic plan view for explaining the alignment failure region due to the spacer.

FIG. 11A is a plan view for explaining an alignment failure region due to a spacer. FIG. 11B is a schematic sectional view along the line XIIIb-XIIIb' in FIG. 11A. For simplification, components other than a spacer and an alignment film are omitted.

As illustrated in FIG. 11B, an alignment film AL is formed on an active matrix substrate or a counter substrate 1 (hereinafter, simply referred to as a "substrate") so as to cover a columnar spacer SP. The alignment film AL has a projecting portion that reflects the shape of the spacer SP. Therefore, when the alignment film AL is rubbed with a rubbing cloth in a predetermined direction (referred to as a "rubbing direction" or a "first direction") d in rubbing processing performed on the alignment film AL, the rubbing cloth is unlikely to come into contact with the alignment film AL on a side in the first side direction d of the projecting portion. As a result, alignment failure regions R1 and R2 with low alignment restriction forces may be generated not only in the periphery of the spacer SP but also a region extending from the spacer SP in the first direction d as illustrated in FIG. 11A. In the specification, the alignment failure region R1 in the periphery of the spacer SP will be referred to as a "first alignment failure region", and the alignment failure region R2 extending in the first direction d from the spacer SP will be referred to as a "second alignment failure region".

The second alignment failure region R2 may be generated inside a spacer shade region Rs extending from the space SP in the first direction d with the same width W as that of the spacer SP. The width (that is, the width of the spacer shadow region Rs) W of the spacer SP is a maximum width of the spacer in a direction that is orthogonal to the first direction d. A length Ls of the spacer shadow region Rs in the first direction d may be equal to or greater than one time and equal to or less than five times the width W of the spacer SP, may be equal to or greater than two times and equal to or less than fifteen times the height of the spacer SP, or may be equal to or less than ½ of the length of a pixel in the first direction d. A length Ld of the second alignment failure region R2 in the first direction d is equal to or less than the length Ls.

Inside the spacer shadow region Rs, the second alignment failure region R2 has a shape in which the width thereof in a direction that is orthogonal to the first direction d decreases away from the side of the spacer SP, for example. In this example, the second alignment failure region R2 is schematically illustrated as an isosceles triangle having a bottom side on the side of the spacer SP. Note that the shape, the length Ld, and the like of the alignment failure region R2 change depending not only on the shape (the height, the width W, and the like) of the spacer SP but also on conditions of the rubbing processing.

Since the spacer SP is typically disposed in a region which is shielded from light with a black matrix, the first alignment failure region R1 is also shielded from light with the black matrix. In order to further improve display properties due to the spacer, it is preferable to shield not only the first alignment failure region R1 but also the second alignment failure region R2 from light.

However, if the black matrix is designed to shield the first alignment failure region R2 from light, the width of the black matrix increases (for example, equal to or greater than the width W), and there is a concern that a pixel aperture ratio significantly decreases. In a case in which the second alignment failure region R2 extends so as to intersect with source wiring lines SL (that is, the rubbing direction d intersects with the source wiring lines SL), in particular, the width of the black matrix further increases. Also, in a case in which the spacer SP is provided on the side of the active matrix substrate, and if it is attempted to shield the second alignment failure region R2 from light with the black matrix formed on the counter substrate, it becomes necessary to further enlarge the width of the black matrix in consideration of precision in substrate attachment.

Note that PTL 1 described above proposes adjustment of a taper angle and the like of a spacer in order to shield a light leakage region generated in the periphery of the spacer from light with a black matrix in a display device using an alignment film processed by a light alignment method. However, even if the method is applied to the display device using the alignment film on which the rubbing processing has been performed, there is a probability that the leakage of light from the second alignment failure region R2 cannot sufficiently be reduced (see the comparative examples in PTL 1).

The present inventor has discovered, based on the above finding, a structure in which a part of source wiring lines is intentionally disposed further outward than the light shielding region by the black matrix and the part is used for shielding the alignment failure region due to the spacer from light and has achieved the invention. According to the embodiment of the invention, it is possible to curb an increase in the width of the black matrix and to curb degradation of display properties due to the alignment failure regions (degradation of a display grade or display contrast).

Embodiments

Figure 1:
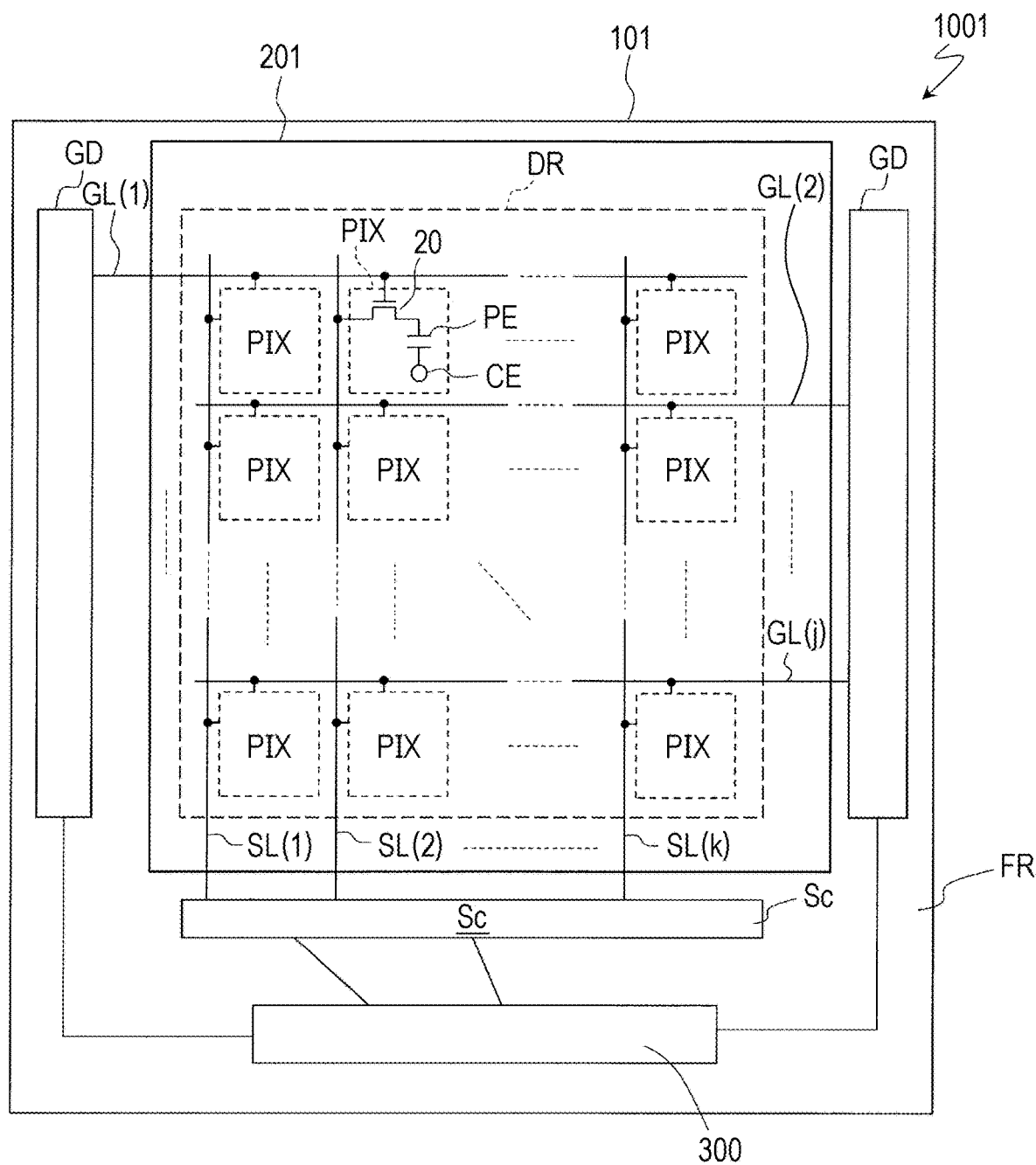
FIG. 1 is an outline diagram illustrating an example of a plane structure of a display device 1001 according to an embodiment of the invention.

FIG. 1 is an outline diagram illustrating an example of a plane structure of a liquid crystal display device 1001 according to an embodiment (hereinafter, simply referred to as a "display device").

The display device 1001 includes an active matrix substrate 101, a counter substrate 201 that faces the active matrix substrate 101, and a liquid crystal layer (not illustrated) disposed between the active matrix substrate 101 and the counter substrate 201. Also, a plurality of spacers (not illustrated) for defining a cell gap are disposed between the active matrix substrate 101 and the counter substrate 201.

The display device 1001 has a display region DR and a region (non-display region or a frame region) FR other than the display region DR. The display region DR is configured of a plurality of pixel regions PIX aligned in a matrix shape. The pixel regions PIX (also referred to as "pixels") are regions corresponding to pixels in the display device. The non-display region FR is a region that is located in the periphery of the display region DR and does not contribute to display.

The active matrix substrate 101 includes, in the display region DR, a substrate 1, a plurality of pixel TFTs 20 supported on the substrate 1, a plurality of pixel electrodes PE, a plurality of gate wiring lines GL(1) to GL(j) (j is an integer of equal to or greater than two; hereinafter, collectively referred to as "gate wiring lines GL") that supply a gate signal to the pixel TFTs 20, and a plurality of source wiring lines SL(1) to SL(k) (k is an integer of equal to or greater than two; hereinafter, collectively referred to as "source wiring lines SL") that supply a source signal to the pixel TFTs 20. The respective pixel regions PIX are defined by the gate wiring lines GL and the source wiring lines SL, for example.

Each of the pixel TFTs 20 and each of the pixel electrodes PE are provided so as to correspond to one of the plurality of pixel regions PIX. A gate electrode of each pixel TFT 20 is electrically connected to one of the gate wiring lines GL, and a source electrode thereof is electrically connected to one of the source wiring lines SL. A drain electrode thereof is electrically connected to each pixel electrode PE.

The source wiring lines SL extend in a direction that intersects with the gate wiring lines GL. In this example, the gate wiring lines GL extend in a direction x while the source wiring lines SL extend in a direction y that is orthogonal to the direction x. Note that in a liquid crystal display device in a transverse electric field mode, the source wiring lines SL may alternately include parts that are inclined by $\alpha°$ in a positive direction (clockwise direction) and parts that are inclined by $-\alpha°$ with respect to the direction y, for example, and may extend in the direction y as a whole.

In the non-display region FR, peripheral circuits such as a driver may be provided. In this example, a gate driver GD configured to drive the gate wiring lines GL and an SSD circuit Sc configured to drive the source wiring lines SL in a time division manner are integrally (monolithically) provided. Also, a driver IC 300 may be mounted in the non-display region FR on the active matrix substrate 101.

In a case in which the active matrix substrate 101 is applied to a display device in a transverse electric field mode such as a fringe field switching (FFS) mode, a common electrode CE is provided on the active matrix substrate 101 for the plurality of pixels PIX.

Meanwhile, the counter substrate 201 includes a substrate, a color filter layer, and a light shielding film that is called a black matrix although not illustrated in the drawing. The black matrix may have a grid shape corresponding to the source wiring lines SL and the gate wiring lines GL, for example. In a case in which the active matrix substrate is applied to a display device in a vertical electric field mode, the counter substrate 201 further includes the common electrode CE.

<Shapes and Disposition of Spacer SP, Source Wiring Lines SL, and Black Matrix BM>

In the display device 1001 according to the embodiment, the source wiring lines SL have a non-overlapping region that does not overlap with the black matrix (namely, that is disposed in a region which is not shielded from light with the black matrix) when seen in a normal line direction of the substrate. A part of the second alignment failure region R2 (FIG. 11A) due to the spacer SP is shielded from light using the non-overlapping region. Note that in the specification, the spacer SP may be either a main spacer or a sub spacer. Alternatively, the spacer SP may include both the main spacer and the sub spacer.

Hereinafter, the shapes and disposition relationships of the spacer SP, the source wiring lines SL, and the black matrix BM in the embodiment will be described with reference to drawings.

Figure 2A:
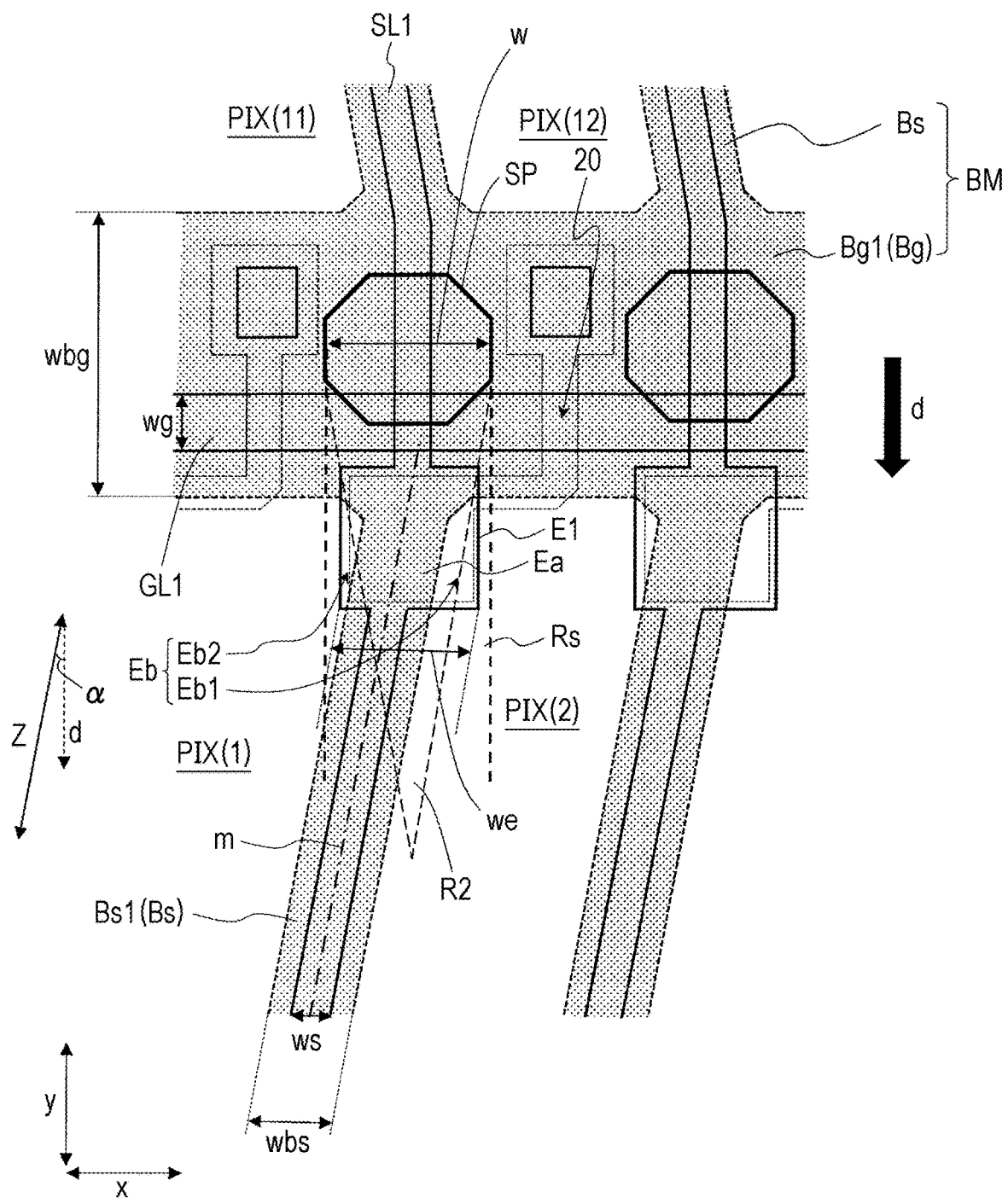
FIG. 2A is a schematic enlarged plan view for explaining a disposition relationship between a spacer SP, a source wiring line SL, and a black matrix BM.

FIG. 2A is a plan view schematic plan view illustrating a part of the display device 1001 and illustrates a vicinity of a region in which the spacer SP is disposed. For simplification, other components such as pixel electrodes are appropriately omitted for understanding disposition relationships of the source wiring lines SL, the spacer SP, and the black matrix BM.

FIG. 2A illustrates a source wiring line SL1, a gate wiring line GL1, a spacer SP disposed in the vicinity of an intersection thereof, and four pixels PIX(1), PIX(2), PIX(11), and PIX(12) located in the periphery of the spacer SP. The source wiring line SL1 is one of the plurality of source wiring lines SL, and the gate wiring line GL1 is one of the plurality of gate wiring lines GL. The pixels PIX(1) and PIX(2) (also referred to as a "first pixel region" and a "second pixel region" in some cases) are adjacent to each other on the side of the first direction d of the gate wiring line GL1 with the source wiring line SL1 interposed therebetween. The pixels PIX(11) and PIX(12) are adjacent to the pixels PIX(1) and PIX(2), respectively, with the gate wiring line GL1 interposed therebetween.

The spacer SP is provided on the active matrix substrate or the counter substrate. The direction d of the rubbing processing performed on the alignment film formed on the substrate provided with the spacer SP is referred to as the "first direction". In this example, the first direction d is a direction that is parallel to the direction y that is orthogonal to the direction (x direction) in which the gate wiring line GL1 extends and a direction directed from the gate wiring line GL1 toward the side of the pixels PIX(1) and PIX(2) (from the upper side toward the lower side in FIG. 2A).

Also, the source wiring line SL1 extends in a direction Z at an angle $\alpha$ with respect to the direction y between the pixels PIX(1) and the pixel PIX(2). The direction Z in which the part of the source wiring line SL1 located between the pixel PIX(1) and the pixel PIX(2) extends will be referred to as a "second direction". Although not illustrated in the drawing, the direction in which a part of the source wiring line SL1 in the vicinity of the spacer SP and on the side in the first direction d of the spacer SP extends is the "second direction" in a case in which the source wiring line SL1 is bent between the pixel PIX(1) and the pixel PIX(2). In a case of the display device in a transverse electric field mode, the angle $\alpha$ between the source wiring lines SL (second direction Z) and the first direction d (that is parallel to the direction y here) may be equal to or greater than 2° and equal to or less than 30° or may be equal to or greater than 5° and equal to or less than 15°. Meanwhile, in a case of the display device in the vertical electric field mode, the first direction d and the source wiring lines SL (second direction Z) may extend parallel to each other (in the direction y, for example).

The black matrix BM is disposed in a grid shape corresponding to the source wiring lines SL and the gate wiring lines GL. For example, the black matrix BM includes a plurality of gate wiring line light shielding portions Bg and a plurality of source wiring line light shielding portions Bs. When seen in the normal line direction of the substrate 1, each gate wiring line light shielding portion Bg extends parallel to corresponding one gate wiring line GL, and each source wiring line light shielding portion Bs extends parallel to corresponding one source wiring line SL. Here, it is assumed that the gate wiring line light shielding portion Bg corresponding to the gate wiring line GL1 is a gate wiring line light shielding portion Bg1 and the source wiring line light shielding portion Bs corresponding to the source wiring line SL1 is a source wiring line light shielding portion Bs1. A width wbg of the gate wiring line light shielding portion Bg1 is greater than a width wg of the gate wiring line GL1.

A width wbs of the source wiring line light shielding portion Bs1 is greater than a width ws of the source wiring line SL1.

The Spacer SP is disposed so as to overlap with the black matrix BM when seen in the normal line direction of the substrate 1. That is, the spacer SP is disposed in a region, which is shielded from light with the black matrix BM. In this example, the spacer SP is disposed so as to overlap with the gate wiring line light shielding portion Bg1 in the vicinity of the intersection between the source wiring line SL1 and the gate wiring line GL1.

As described above with reference to FIG. 1, the first alignment failure region R1 (not illustrated) may be generated in the periphery of the spacer SP. Also, the second alignment failure region R2 extending in the first direction d may be generated on the side in the first direction d of the spacer SP. The second alignment failure region R2 is formed inside the spacer shadow region Rs extending from the spacer SP on the side of the first direction d with the same width as that of the spacer SP.

The first alignment failure region R1 is located in a region, which is shielded from light with the black matrix BM. Meanwhile, a part of the spacer shadow region Rs (that is, a region in which the second alignment failure region R2 may be generated) is not shielded from light with the black matrix BM. That is, the spacer shadow region Rs includes a first region that overlaps with the black matrix BM and a second region that does not overlap with the black matrix BM when seen in the normal line direction of the substrate 1.

The source wiring line SL1 has a first wide width portion E1 between the pixel PIX(1) and the pixel PIX(2). The first wide width portion E1 is disposed in the vicinity of the spacer SP and on the side of the first direction d. In this specification, "the vicinity of the spacer SP" means inside of the region in which the alignment failure due to the spacer SP may be generated. The first wide width portion E1 is disposed so as to at least partially overlap with the spacer shadow region Rs (FIG. 11A), for example. The width we of the first wide width portion E1 is greater than the width ws of the source wiring line SL1. Note that the widths we and ws indicate widths in the direction that perpendicularly intersects with the source wiring line SL1. The width we of the first wide width portion E1 may be greater than the width wbs of the source wiring line light shielding portion Bs1.

The first wide width portion E1 includes an overlapping region Ea that overlaps with the black matrix BM and a non-overlapping region Eb that does not overlap with the black matrix BM when seen in the normal line direction of the main surface of the substrate 1. That is, the non-overlapping region Eb of the first wide width portion E1 sticks out of the region, which is shielded from light with the black matrix BM. The area of the non-overlapping region Eb in the first wide width portion E1 that does not overlap with the black matrix BM may be equal to or greater than ⅕ and equal to or less than ⅗, or more preferably, the area may be equal to or greater than ⅓ and equal to or less than ½ of the area of the first wide width portion E1, for example.

The non-overlapping region Eb in the first wide width portion E1 overlaps with at least a part of the spacer shadow region Rs (that is, at least a part of the second region of the spacer shadow region Rs that does not overlap with the black matrix BM).

According to the embodiment, it is possible to shield, from light, the spacer shadow region Rs that is a region in which the second alignment failure region R2 may be formed using not only the black matrix BM but also the source wiring lines SL. It is possible to reduce influences of alignment failures due to the spacer SP on display properties by shielding the part of the spacer shadow region Rs, not shielded from light with the black matrix BM, using the first wide width portion E1. Therefore, it is possible to improve a display grade and display contrast without enlarging the width of the black matrix BM.

In one example in which the maximum width W of the spacer SP in the direction x is 10 μm and the height thereof is 3 μm, the second alignment failure region R2 has an isosceles triangular shape with a bottom side of 10 μm, a height of 30 μm, and an area of 150 μm², for example. In a case in which the pitches of the pixel regions PIX in the direction x are 25 μm and the pitches thereof in the direction y are 75 μm, the width of the source wiring lines SL may be 4 μm, for example, and the first wide width portion E1 may have a rectangular shape (a longer side is parallel to the direction y or the second direction Z) of 9.5 μm×10.5 μm.

In the example illustrated in FIG. 2A, a center line m of the source wiring line SL1 extends obliquely (in the second direction Z that is inclined with respect to the first direction d) across the spacer shadow region Rs when seen in the normal line direction of the substrate 1 since the source wiring line SL1 is inclined with respect to the first direction d. The part of the spacer shadow region Rs located on a first side (the right side in the illustrated example) of the center line m is larger than the part located on a second side (the left side in the illustrated example). That is, a wider part, which is not shielded from light with the black matrix BM (source wiring line light shielding portion Bs1), is present on the first side of the center line m in the spacer shadow region Rs.

The first wide width portion E1 may be asymmetric with respect to the center line m of the source wiring line SL1 when seen in the normal line direction of the substrate 1. For example, the part of the first wide width portion E1 located on the first side (the right side here) of the center line m may be larger than the part located on the second side (the left side here).

Also, the non-overlapping region Eb of the first wide width portion E1 that does not overlap with the black matrix BM may be disposed on both sides of the source wiring line SL1 (or the source wiring line light shielding portion Bs1). The area of a first part Eb1, of the non-overlapping region Eb, on the first side of the source wiring line light shielding portion Bs1 may be larger than the area of a second part Eb2 located on the second side. Alternatively, the non-overlapping region Eb may be disposed only on the first side of the source wiring line SL1 (or the source wiring line light shielding portion Bs1).

The first wide width portion E1 may function as a source electrode of each pixel TFT 20, for example. In this case, a source contact portion may be configured by connecting the semiconductor layer of the pixel TFT 20 to the first wide width portion E1 of the source wiring line SL1 as will be described later.

Figure 2B:
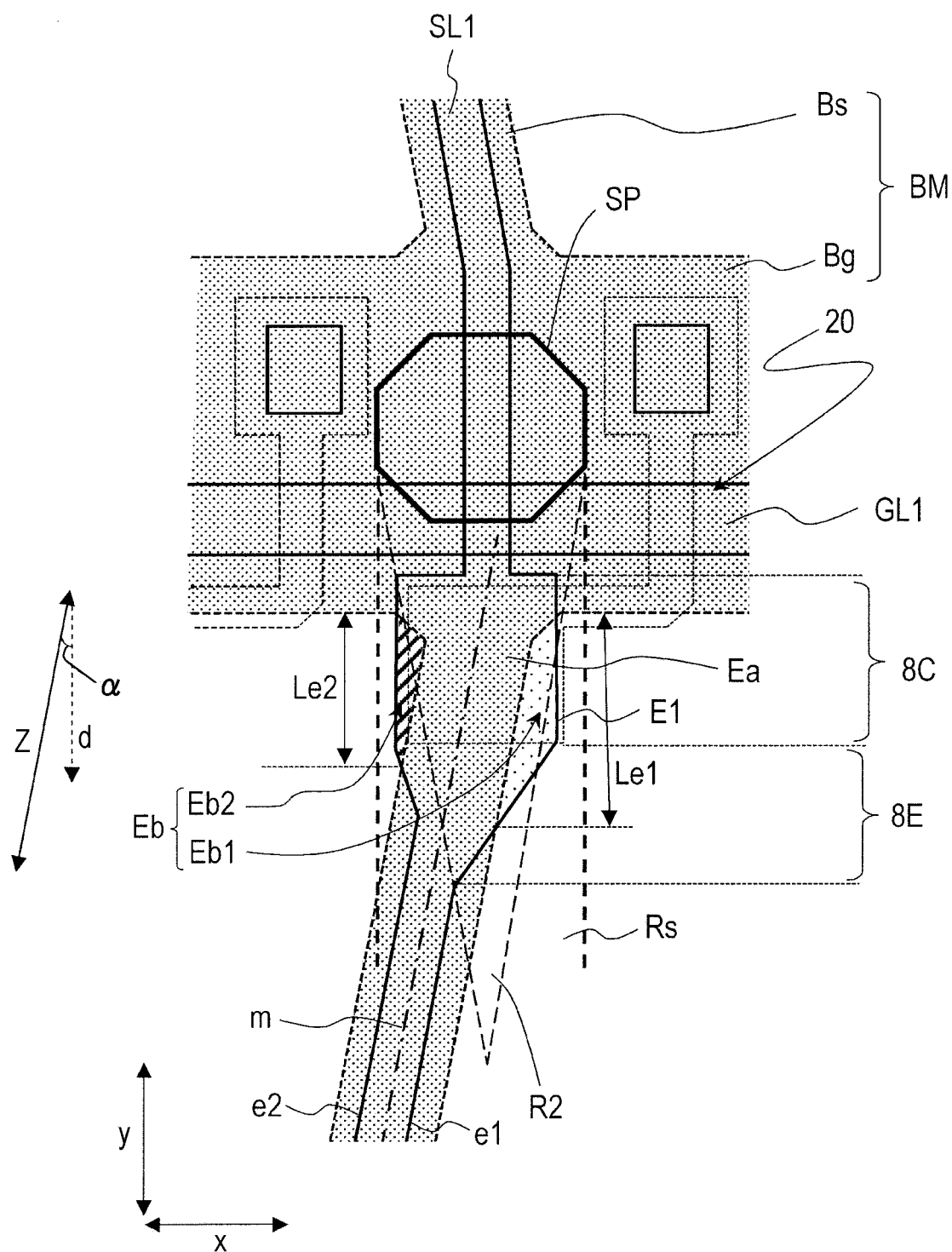
FIG. 2B is a schematic enlarged plan view for explaining the disposition relationship between the spacer SP, the source wiring line SL, and the black matrix BM.
Figure 2C:
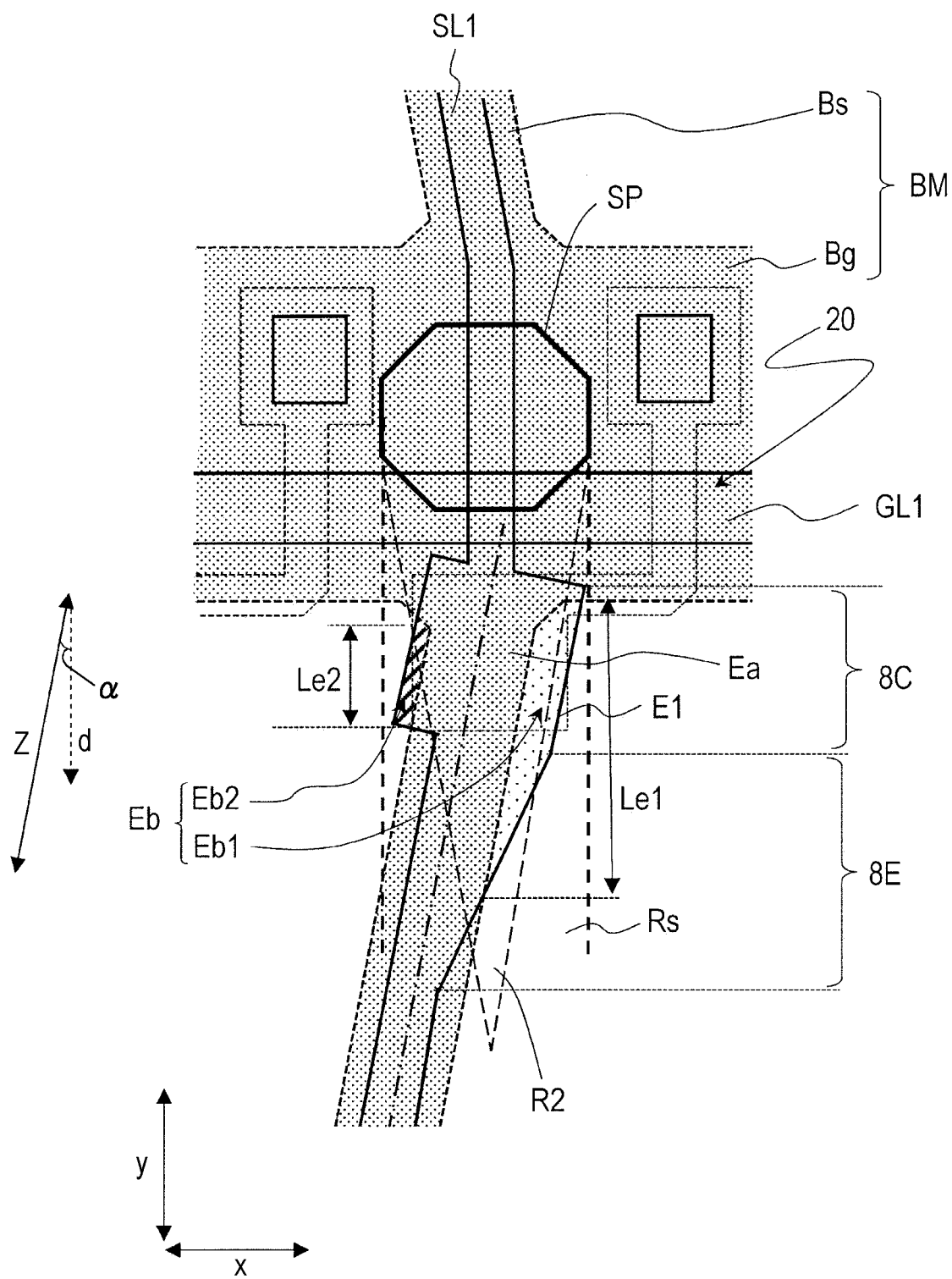
FIG. 2C is a schematic enlarged plan view for explaining the disposition relationship between the spacer SP, the source wiring line SL, and the black matrix BM.

FIGS. 2B and 2C are plan views respectively exemplifying other first wide width portions E1 according to the embodiment.

As illustrated in FIGS. 2B and 2C, the first wide width portion E1 may not have a rectangular shape. For example, the first wide width portion E1 may include a contact part 8C with a size necessary for a source contact portion and an expanded part 8E extending from the contact part 8C on the side of the first direction d.

The first wide width portion E1 and the semiconductor layer of the pixel TFT 20 overlap with each other with an insulating layer interposed therebetween, for example, at the source contact portion, and the first wide width portion E1 and the semiconductor layer are in contact with each other in a contact hole formed in the insulating layer. In this configuration, the contact part 8C is a part including a region that is in contact with the semiconductor layer (a part that overlaps with the contact hole).

At least a part of the expanded part 8E does not overlap with the black matrix BM and overlaps with the spacer shadow region Rs when seen in the normal line direction of the main surface of the substrate 1. That is, the expanded part 8E is formed such that light onto a part of the spacer shadow region Rs (second alignment failure region R2) can be shielded from light.

The expanded part 8E may extend from the contact part 8C in the first direction d with a smaller width than the width of the contact part 8C. The width of the expanded part 8E may be smaller than the width of the contact hole. The width of the expanded part 8E may decreases away from the contact part 8C in the first direction d.

On the assumption that an edge e1 of the source wiring line SL on the first side is a "first edge" and an edge e2 on the second side is a "second edge", the expanded part 8E may be formed at each of both the edges e1 and e2 of the source wiring line SL (FIG. 2B). Alternatively, the expanded part 8E may be disposed only at the first edge e1 of the source wiring line SL (FIG. 2C).

The part of the first wide width portion E1 on the first side of the center line m may be larger than the part located on the second side. Further, the expanded part 8E may be larger on the first side of the center line m than on the second side. Note that the contact part 8C itself may be symmetric with respect to the center line m as illustrated in FIG. 2C. It is possible to form an asymmetric first wide width portion E1 with respect to the center line m by providing the expanded part 8E in this case as well.

The area of the first part Eb1 of the non-overlapping region Eb of the first wide width portion E1 located on the first side of the source wiring line SL1 is larger than the area of the second part Eb2 located on the first side of the source wiring line SL1 when seen in the normal line direction of the substrate 1. Also, the length Le1 of the first part Eb1 in the first direction d may be longer than the length Le2 of the second part Eb2 in the first direction d. In this manner, it is possible to more reliably shield the second alignment failure region R2 from light while securing a pixel aperture ratio.

Although not illustrated in the drawing, the source wiring line may not have the first wide width portion E1 between two other pixel regions that are adjacent to each other (also referred to as a third pixel region and a fourth pixel region), namely between pixel regions, at least one of which is different from the first and second pixel regions PIX(1) and PIX(2) in the display device 1001 according to the embodiment. For example, the source wiring line may have a second wide width portion with a larger width than the width ws of the source wiring line between the third pixel region and the fourth pixel region. The size or the shape of the second wide width portion may be different from that of the first wide width portion. The entire second wide width portion may overlap with the black matrix, or alternatively, a region of the second wide width portion that does not overlap with the black matrix may be smaller than the non-overlapping region of the first wide width portion E1, when seen in the normal line direction of the substrate 1.

Hereinafter, the structure of the display device according to the embodiment will be more specifically described using a display device in the FFS mode as an example. Note that in the following description, components with substantially the same functions will be represented by common reference numerals and description thereof will be omitted in some cases.

(Structure of Display Device 1001)

Figure 3A:
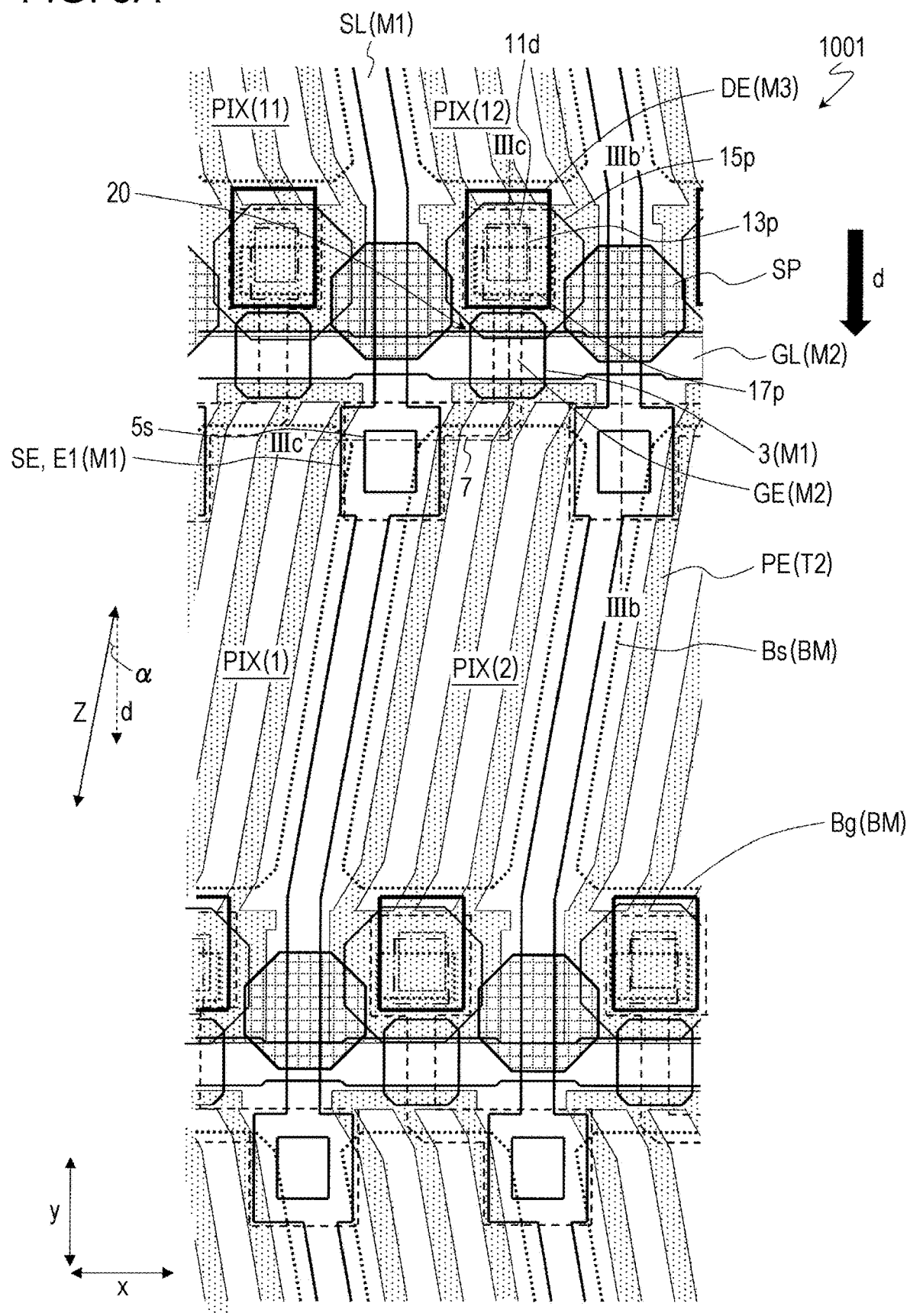
FIG. 3A is a plan view that exemplifies a part of the display device 1001.
Figure 3B:
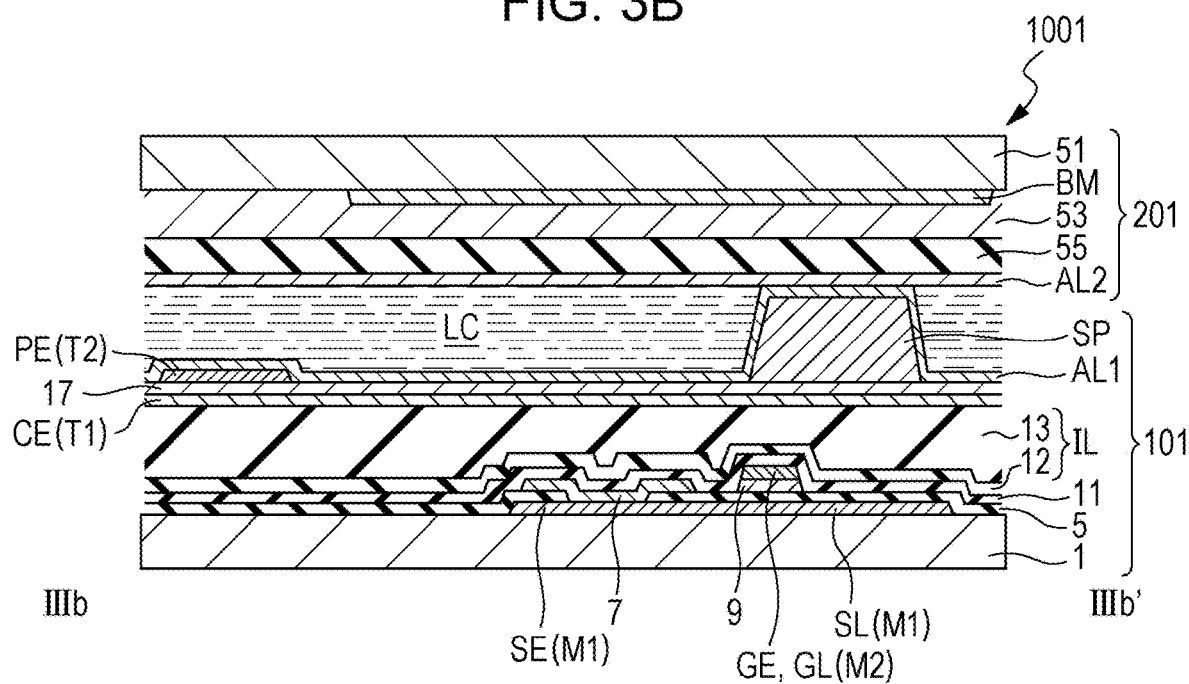
FIG. 3B is a schematic sectional view of the display device 1001.
Figure 3C:
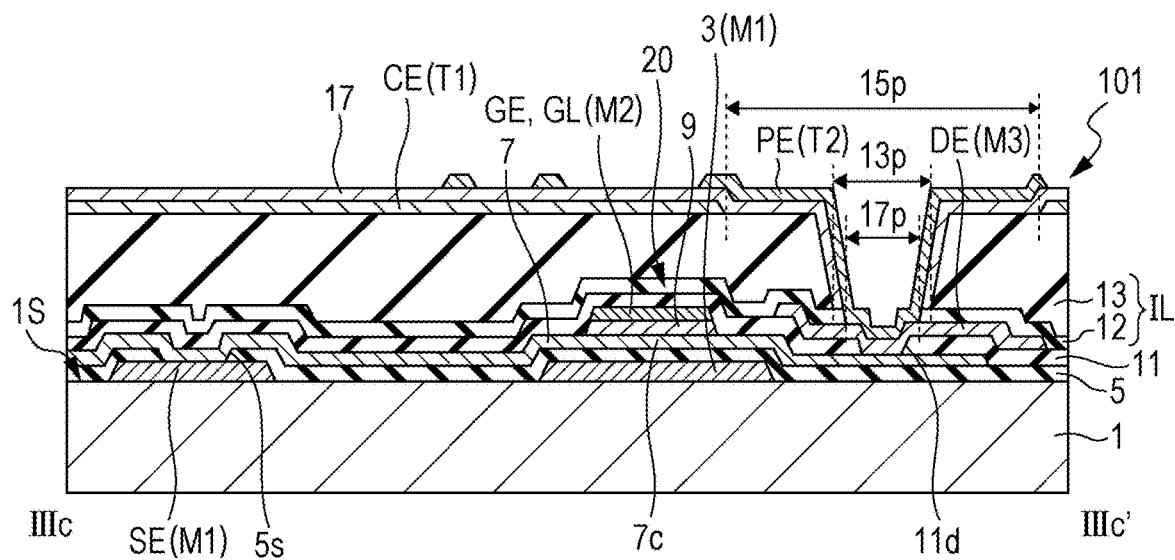
FIG. 3C is a sectional view illustrating a part of an active matrix substrate 101 in the display device 1001.

FIG. 3A is a plan view exemplifying a part of the display device 1001 according to the embodiment. FIG. 3B is a schematic sectional view of the display device 1001 along the line IIIb-IIIb' in FIG. 3A. Also, FIG. 3C is a sectional view illustrating a part of the active matrix substrate 101. FIG. 3C illustrates a sectional structure of the pixel TFT 20 along the line IIIc-IIIc' in FIG. 3A.

<Active Matrix Substrate 101>

First, the structure of the active matrix substrate 101 will be specifically described.

The active matrix substrate 101 has the substrate 1, the plurality of pixel TFTs 20 supported on a main surface 1S of the substrate 1, the plurality of gate wiring lines GL, the plurality of source wiring lines SL, the common electrode CE, the pixel electrodes PE, and a first alignment film AL1. Also, a plurality of spacers SP are disposed on the active matrix substrate 101 in this example. The first alignment film AL1 is formed so as to cover the spacers SP.

A plurality of conductive layers (typically, metal layers) formed on the active matrix substrate 101 on the side of the main surface 1S of the substrate 1 will be referred to as a first metal layer M1, a second metal layer M2, and a third metal layer M3 from the side of the substrate 1. Also, at least two transparent conductive layers are formed on the active matrix substrate 101 in the FFS mode. Among these, the layer located on the side of the substrate 1 will be referred to as a lower transparent conductive layer T1, and the layer formed thereon will be referred to as an upper transparent conductive layer T2. In the example illustrated in FIGS. 3A to 3C, the first metal layer M1 includes the source wiring lines SL, the second metal layer M2 includes the gate wiring lines GL, and the third metal layer M3 includes the drain electrodes of the pixel TFTs 20. The lower transparent conductive layer T1 includes the common electrode CE, and the upper transparent conductive layer T2 includes the pixel electrodes PE.

Note that in the following description, numbers in brackets after reference numerals for electrodes or wiring lines will represent the metal layers or the transparent conductive layers in which the electrodes or wiring lines are formed in some cases. For example, "(M1)" will be added to the reference numerals for the electrode or the wiring line formed in the first metal layer M1 in some cases.

The active matrix substrate 101 has the plurality of pixel regions PIX aligned in a two dimensional manner. The respective pixel regions PIX are regions surrounded by the source wiring lines SL and the gate wiring lines GL, for example, and are aligned in the two-dimensional manner in the direction x and the direction y. The direction y is a direction that intersects the direction x, and for example, is a direction that perpendicularly intersects with the direction x.

The gate wiring lines GL extend in the direction x. Also, the source wiring lines SL extend in the direction y as a whole while being alternately inclined by a predetermined angle α in the positive direction (clockwise direction) and the negative direction (counterclockwise direction) with respect to the direction y. In this example, the source wiring lines SL are inclined in different directions for the respective pixel regions PIX. Note that the source wiring lines SL have points (bending points) at which inclination directions change in the pixel regions PIX in some cases.

Here, description will be given using the two pixels PIX(1) and PIX(2) that are adjacent to each other with the source wiring line SL interposed therebetween and the pixels PIX(11) and PIX(12) that are adjacent to the pixels PIX(1) and PIX(2) with the gate wiring line GL interposed therebetween similarly to FIG. 2A. The first direction d is a rubbing direction of the first alignment film AL1. The first direction d is parallel to the direction y, for example, and is a direction from the upper side toward the lower side (that is, from the pixel regions PIX(11) and PIX(12) to the side of the pixel regions PIX(1) and PIX(2). The second direction Z is a direction in which the source wiring line SL extends between the pixel PIX(1) and the pixel PIX(2). The second direction Z is inclined by an angle α in the positive direction with respect to the direction y, for example. The angle α is equal to or greater than 2° and equal to or less than 30° as described above.

As described above with reference to FIG. 2A, the source wiring line SL has a first wide width portion E1 between the pixel region PIX(1) and the pixel region PIX(2). At least a part of the non-overlapping region of the first wide width portion E1 that does not overlap with the black matrix BM overlaps with the spacer shadow region Rs (not illustrated) extending form the spacer SP in the first direction d when seen in the normal line direction of the main surface 1S of the substrate 1. The entire non-overlapping region may overlap with the spacer shadow region Rs. In this manner, it is possible to shield the part of the alignment failure region due to the spacer SP, which is not shielded from light with the black matrix BM, with the first wide width portion E1.

Each pixel region PIX has the substrate 1, the pixel TFT 20 supported on the main surface 1S of the substrate 1, the pixel electrode PE (T2), and the common electrode CE (T1).

The pixel TFT 20 has an oxide semiconductor layer 7 including a channel region 7c, a gate electrode GE, a gate insulating layer 9 located between the oxide semiconductor layer 7 and the gate electrode GE, and a source electrode SE and a drain electrode DE that are electrically connected to the oxide semiconductor layer 7.

In this example, the pixel TFT 20 has a top gate structure. The pixel TFT 20 has the source electrode SE (M1), the oxide semiconductor layer 7 disposed on the source electrode SE with a lower insulating layer 5 interposed therebetween, the gate insulating layer 9 formed at least on the channel region 7c on the oxide semiconductor layer 7, the gate electrode GE (M2) disposed on the channel region 7c with the gate insulating layer 9 interposed therebetween, and the drain electrode DE (M3).

The source electrode SE may be a part of the source wiring line SL. In this example, (a part of) the first wide width portion E1 of the source wiring line SL functions as a source electrode SE. Note that the first wide width portion E1 may be formed separately from the source electrode SE at the source wiring line SL.

The first metal layer M1 including the source wiring line SL is covered with the lower insulating layer 5.

The oxide semiconductor layer 7 is disposed on the lower insulating layer 5 and in an opening (source-side opening) 5s formed in the lower insulating layer 5 and is electrically connected to a part of the source electrode SE (here, the first wide width portion E1) in the source-side opening 5s. The source electrode SE and the oxide semiconductor layer 7 may be in direct contact with each other.

The gate insulating layer 9 and the gate electrode GE are disposed on the oxide semiconductor layer 7. The gate electrode GE is disposed so as to at least partially overlap with the channel region 7c when seen in the normal line direction of the main surface 1S of the substrate 1. Here, the oxide semiconductor layer 7 extends across the corresponding gate wiring line GL when seen in the normal line direction of the main surface 1S of the substrate 1, and the part of the gate wiring line GL that overlaps with the oxide semiconductor layer 7 functions as the gate electrode GE. The edges of the gate insulating layer 9 and the gate electrode GE may be matched with each other when seen in the normal line direction of the main surface 1S of the substrate 1.

The second metal layer M2 including the gate electrode GE, the oxide semiconductor layer 7, and the gate insulating layer 9 are covered with an upper insulating layer 11.

The drain electrode DE (M3) is disposed on the upper insulating layer 11 and in an opening (drain-side opening) 11d formed in the upper insulating layer 11 and is electrically connected to another part of the oxide semiconductor layer 7 in the drain-side opening 11d. The drain electrode DE may have an island shape. The drain electrode DE and the oxide semiconductor layer 7 may be in direct contact with each other.

A channel light shielding layer 3 (M1) may be provided on the oxide semiconductor layer 7 on the side of the substrate 1. The channel light shielding layer 3 is disposed so as to overlap with at least the channel region 7c when seen in the normal line direction of the main surface 1S of the substrate 1. The channel light shielding layer 3 may be a floating layer, which is electrically floating, or may be connected to a fixed potential.

The part of the oxide semiconductor layer 7 that does not overlap with the gate electrode GE when seen in the normal line direction of the main surface 1S of the substrate 1 may be a low-resistance region with a lower specific resistance than the part (here, the channel region 7c) that overlaps with the gate electrode GE. The low-resistance region may be formed by performing low-resistance processing on the oxide semiconductor layer 7 using the gate electrode GE and the gate insulating layer 9 as a mask, for example.

The pixel TFT 20 is covered with an interlayer insulating layer IL. The interlayer insulating layer IL may have a laminated structure of an inorganic insulating layer 12 and an organic insulating layer 13 disposed on the inorganic insulating layer 12, for example.

The common electrode CE (T1) is disposed on the interlayer insulating layer IL. The pixel electrode PE (T2) is disposed on the common electrode CE with a dielectric layer 17 interposed therebetween. The pixel electrode PE is separated for each pixel. The pixel electrode PE has a slit or a notch in each pixel region PIX. The common electrode CE may not be separated for each pixel.

The pixel electrode PE is electrically connected to the drain electrode DE of the pixel TFT 20. In this example, the pixel electrode PE is in contact with the drain electrode DE in a pixel contact hole formed in the interlayer insulating layer IL and the dielectric layer 17. The pixel contact hole may be formed by an opening 13p formed in the organic insulating layer 13 and an opening 17p formed in the dielectric layer 17 and the inorganic insulating layer 12, for example. The pixel contact hole may partially or entirely overlap with the drain-side opening 11d. Note that the configuration and the disposition of the pixel contact hole are not limited to those in the illustrated example.

The common electrode CE may have an opening 15p over the region of the pixel TFT 20 at which the pixel contact hole is formed and may be formed over the entire pixel region PIX except for the region.

In the embodiment, the pixel electrode PE may be formed in any one of the lower transparent conductive layer T1 and the upper transparent conductive layer T2, and the common electrode CE may be formed in the other one. For example, the common electrode CE may be formed in the upper transparent conductive layer T2, and the pixel electrode PE may be formed in the lower transparent conductive layer T1. A slot or a notch is formed in the electrode (the pixel electrode PE in the illustrated example) formed in the upper transparent conductive layer T2.

A plurality of columnar spacers SP and the first alignment film AL1 are disposed on the upper transparent conductive layer T2. The spacers SP are disposed in a region, which is shielded from light with the black matrix BM formed on the counter substrate 201. The spacers SP may be disposed in the vicinity of intersections of the source wiring lines SL and the gate wiring lines GL, for example. The first alignment film AL1 is formed so as to cover the spacers SP. Rubbing processing is performed on the first alignment film AL1 in the first direction d.

In this example, the pixel TFTs 20 are disposed such that the channel length direction follows the direction y (TFT vertical placement structure). The channel length direction indicates a direction in which a current flows in the channel region in a plane that is parallel to the main surface 1S of the substrate 1, and a channel width direction indicates a direction that perpendicularly intersects with the channel length direction.

Referring to the pixel TFT 20 in the pixel region PIX(12) as an example for explanation, the oxide semiconductor layer 7 of the pixel TFT 20 in the pixel region PIX(12) may extend from another pixel region PIX(2) that is adjacent in the direction y up to the pixel region PIX(12) across the gate wiring line GL when seen in the normal line direction of the main surface 1S of the substrate 1. A part of the oxide semiconductor layer 7 that overlaps with the gate wiring line GL is the channel region 7c. One end of the oxide semiconductor layer 7 is connected to the drain electrode DE in the pixel region PIX(12). The other end is connected to a part (here, the first wide width portion E1) of the source wiring line SL in another pixel region PIX(2).

Although not illustrated in the drawing, the pixel TFT 20 may not have the drain electrode DE. In this case, the pixel electrode PE may be electrically connected to the oxide semiconductor layer 7 by bringing the pixel electrode PE into direct contact with the oxide semiconductor layer 7 in the pixel contact hole. Alternatively, it is also possible to use a part of the low-resistance region of the oxide semiconductor layer 7 as the pixel electrode PE.

<Counter Substrate 201>

The counter substrate 201 has a substrate 51, a black matrix BM supported on the substrate 51, a color filter layer 53, and a second alignment film AL2. An overcoated layer (for example, an organic insulating layer) 55 may be formed between the color filter layer 53 and the second alignment film AL2.

The black matrix BM may have a grid shape that has opening regions corresponding to the respective pixel regions PIX in the display region DR. As described above with reference to FIG. 2, the black matrix BM includes a source wiring line light shielding portion Bs corresponding to the source wiring lines SL and a gate wiring line light shielding portion Bg corresponding to the gate wiring lines GL.

Rubbing processing is performed on the second alignment film AL2 in a predetermined direction. In this example, no spacers SP are provided on the counter substrate 201, and the second alignment film AL2 does not have relatively large projecting portions that reflect the shapes of the spacers SP. Therefore, no alignment failure region due to the spacers SP is generated when the rubbing processing is performed on the second alignment film AL2.

<Liquid Crystal Layer LC>

A liquid crystal layer LC is disposed between the active matrix substrate 101 and the counter substrate 201. The liquid crystal layer LC is in contact with the first alignment film AL1 and the second alignment film AL2.

Liquid crystal molecules in the liquid crystal layer LC are oriented due to a restriction force of the alignment films AL1 and AL2 respectively disposed on both sides (the side of the active matrix substrate 101 and the side of the counter substrate 201) of the liquid crystal layer LC. When a horizontal alignment film on which rubbing processing has been performed is used, the liquid crystal molecules are aligned such that the longitudinal axis direction thereof is parallel to the alignment axis azimuth (hereinafter, "initial alignment axis azimuth") in a state in which no voltage is applied to the liquid crystal layer LC (when no voltage is applied). The initial alignment axis azimuth is an azimuth that is parallel to the rubbing direction.

In a case in which dielectric anisotropy of the liquid crystal is positive, the rubbing direction of the first alignment film AL1 on the side of the active matrix substrate 101 is set to be substantially the same (for example, a generated angle is 10°) as a direction in which a slit-shaped opening in an upper layer transparent electrode (for example, the pixel electrode PE) extends. The rubbing direction of the second alignment film AL2 on the side of the counter substrate 201 is set to be antiparallel to the rubbing direction of the first alignment film AL1. In a case in which the dielectric anisotropy of the liquid crystal is negative, the rubbing direction of the first alignment film AL1 on the side of the active matrix substrate 101 is set to be a direction that is substantially perpendicular (for example, a generated angle is 10°) to the direction in which the slit-shaped opening in the upper layer transparent electrode (for example, the pixel electrode PE) extends. The rubbing direction of the second alignment film AL2 on the side of the counter substrate is set, for example, to be antiparallel to the rubbing direction of the first alignment film AL1.

The rubbing direction may be analyzed by the following method, for example. It is possible to determine the initial alignment axis azimuth of the alignment film on a side of a polarizing plate on the basis of a relationship between a polarizing plate axis of the display device, and it is then possible to specify the rubbing direction by measuring a pretilt angle in a panel state. Alternatively, the rubbing direction can also be specified by analyzing a surface state of the alignment film using an atomic force microscope. Note that the initial alignment axis azimuth can also be determined through observation with black display (turned off).

<Effects>

The display device 1001 according to the embodiment has the aforementioned configuration and thus exhibits the following effects.

As described above with reference to FIG. 2, it is possible to shield the second alignment failure region R2 due to the spacer SP from light using the first wide width portion E1 of the source wiring line SL. Therefore, it is possible to curb an increase in width of the black matrix and to curb degradation of a display grade and display contrast.

Also, the spacers SP are provided on the side of the active matrix substrate 101 in the display device 1001. If it is attempted to shield the second alignment failure region R2 from light using the black matrix on the side of the counter substrate as in the related art, it is necessary to increase the width or the area of the black matrix in consideration of precision of attachment of substrates. Meanwhile, the display device 1001 does not require a design in consideration of precision of attachment of substrates since the second alignment failure region R2 is shielded from light using the first metal layer M1 provided on the active matrix substrate 101, on which the spacers SP are also provided. Therefore, it is possible to curb an increase in the light shielding area that occupies the pixel region and further to improve a pixel aperture ratio.

Further, the first wide width portion E1 of the source wiring line SL is used as a source contact portion that electrically connects the pixel TFT 20 and the source wiring line SL on the active matrix substrate 101. Typically, the width of each source wiring line is set to be small on the high-definition active matrix substrate in order to secure the pixel aperture ratio. In the embodiment, it is possible to secure the contact area and to further curb a decrease in pixel aperture ratio by disposing the source contact portion in the spacer shadow region Rs and using the source contact portion as a light shielding portion that complements the black matrix BM.

Note that in the display device in the related art, the source contact portion is disposed in the region, which is shielded from light with the black matrix, in many cases. For example, the source contact portion and the channel light shielding film may be disposed in the direction x so as to overlap with the gate wiring line light shielding portion of the black matrix in some cases. However, in a case in which the source wiring line (including the source electrode) and the channel light shielding film are formed in the same metal layer, it is necessary to secure a gap between the source contact portion and the channel light shielding film. Therefore, it is difficult to apply the configuration in which the source contact portion and the channel light shielding film are disposed in the direction x to the high-definition active matrix substrate with small pixel pitches (the width of the pixel region PIX in the direction x). Meanwhile, according to the embodiment, the first wide width portion E1 that serves as the source contact portion and the channel light shielding layer 3 are disposed in the same metal layer (first metal layer M1) with a deviation in the direction y. Therefore, it is possible to suitably apply the embodiment to the high-definition active matrix substrate with small pixel pitches as well.

Modification Examples

The configuration of the display device according to the embodiment is not limited to the configuration of the display device 1001 illustrated in FIGS. 3A to 3C. Hereinafter, display devices according to modification examples of the embodiment will be described with reference to drawings. For simplification, the same reference numerals will be applied to components in the following drawings that are similar to those in FIGS. 3A to 3C, and description thereof will be appropriately omitted.

First Modification Example

Although the spacers SP are provided on the side of the active matrix substrate in the display device 1001, the spacers SP may be provided on the side of the counter substrate. In this case, the "first direction d" illustrated in FIG. 1 is a direction of the rubbing processing performed on the alignment film of the counter substrate.

Figure 4:
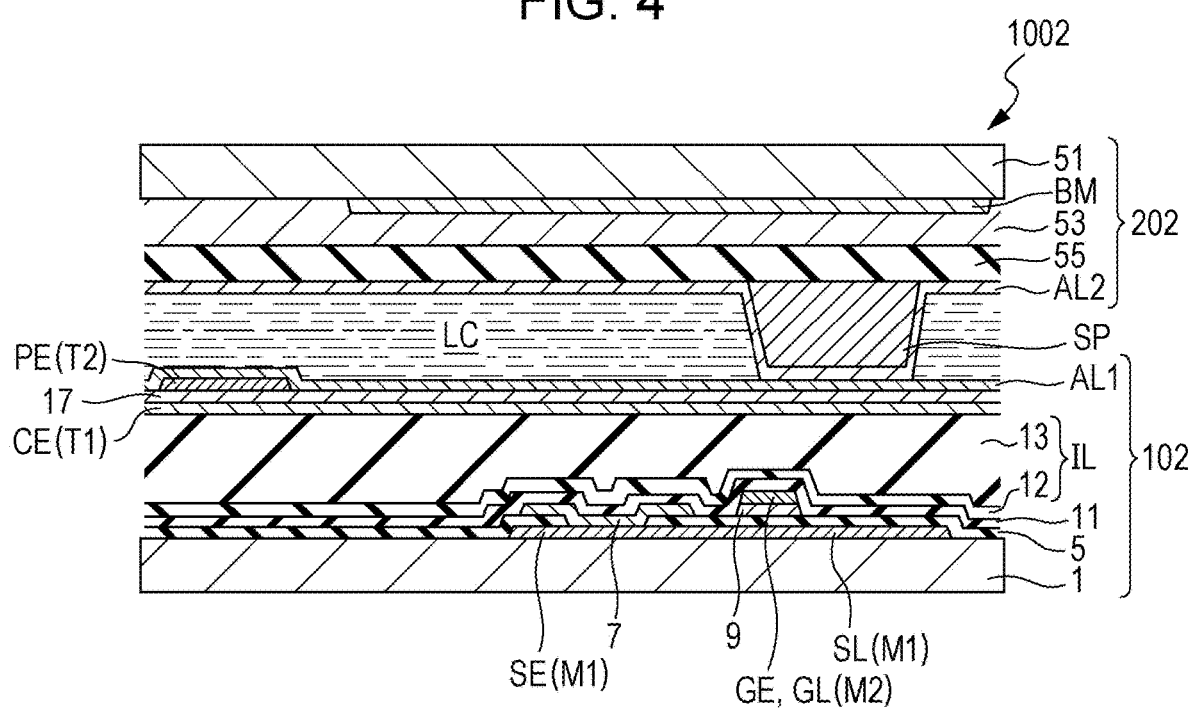
FIG. 4 is a schematic sectional view of a display device 1002 according to a first modification example.

FIG. 4 is a schematic sectional view illustrating a display device 1002 according to the first modification example of the embodiment.

The display device 1002 has an active matrix substrate 102, a counter substrate 202, and a liquid crystal layer LC disposed therebetween. The display device 1002 is different from the display device 1001 in that the spacers SP are provided on the side of the counter substrate 202.

In the display device 1002, the spacers SP are disposed on the second alignment film AL2 of the counter substrate 202 on the side of the substrate 51. The second alignment film AL2 are formed to cover the spacers SP and has projecting portions that reflect the shapes of the spacers SP. Therefore, an alignment failure region with a low alignment restriction force is generated due to the spacers SP when rubbing processing is performed on the second alignment film AL2. The second alignment failure region R2 illustrated in FIG. 1 is generated at the spacer SP on the side of the rubbing direction of the second alignment film AL2. Therefore, the first wide width portion E1 is disposed in the vicinity of the spacer SP and on the side of the rubbing direction of the second alignment film AL2.

Second Modification Example

Although the gate wiring lines GL (M2) is formed in an upper layer than the source wiring lines SL (M1) in the display device 1001, the source wiring lines SL may be formed in the upper layer (for example, in the third metal layer M3). Also, in a case in which TFTs with a bottom gate structure are used as the pixel TFTs 20, the gate wiring lines GL may be formed in the oxide semiconductor layer 7 on the side of the substrate 1, and the source wiring lines SL may be formed in the upper layer of the oxide semiconductor layer 7.

Figure 5A:
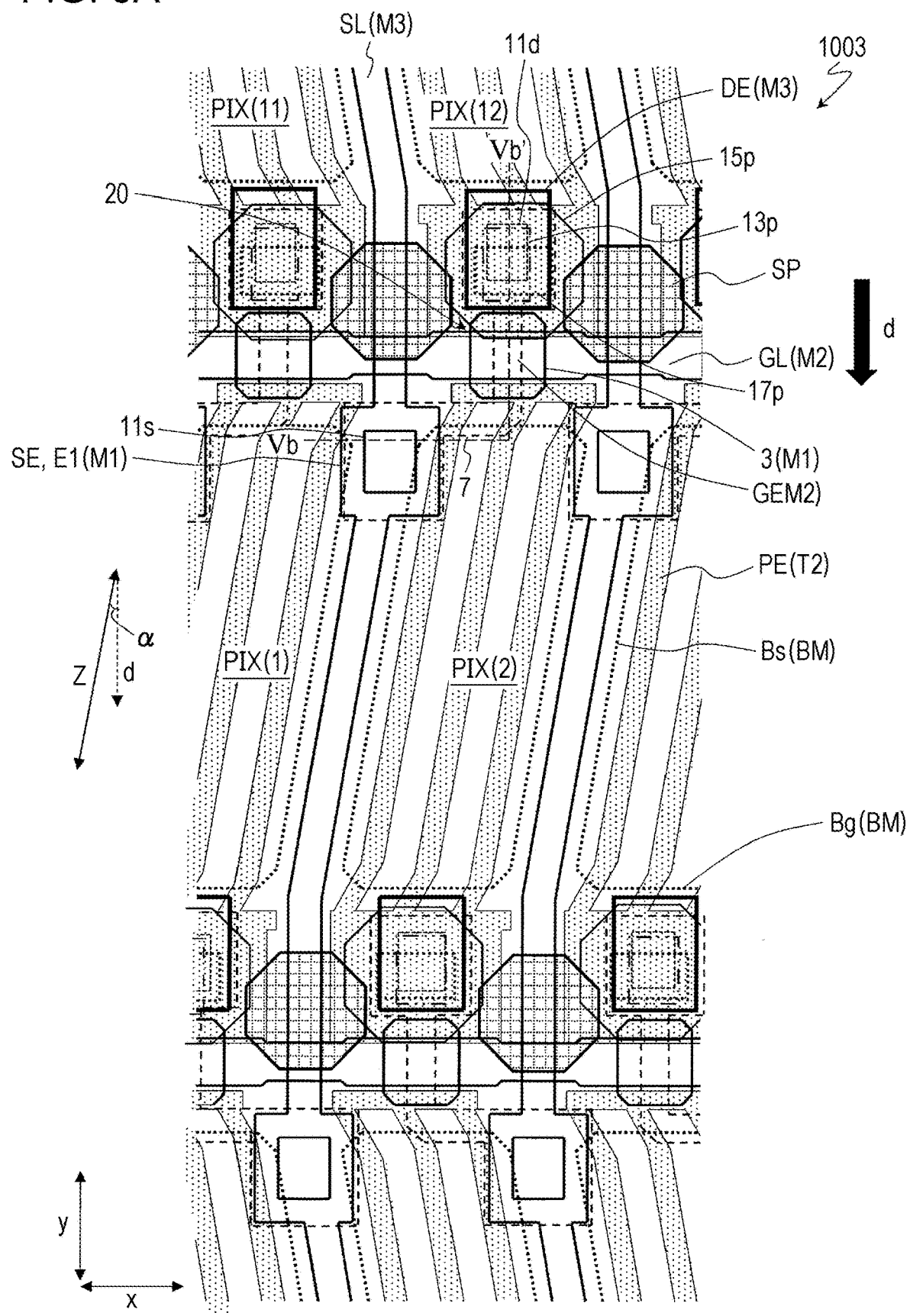
FIG. 5A is a schematic plan view of a display device 1003 according to a second modification example.
Figure 5B:
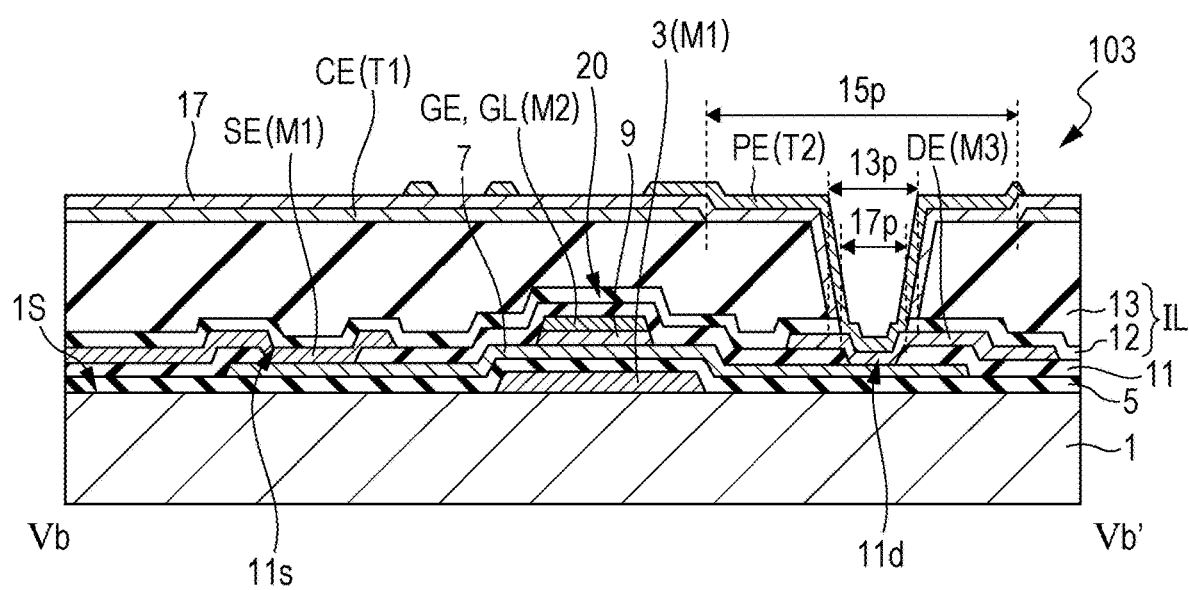
FIG. 5B is a sectional view of an active matrix substrate 103 in the display device 1003.

FIG. 5A is a plan view illustrating a display device 1003 according to the second modification example, and FIG. 5B is a sectional view of an active matrix substrate 103 of the display device 1003 and illustrates a sectional structure along the line Vb-Vb' in FIG. 5A.

The display device 1003 is different from the display device 1001 in that the source wiring lines SL is formed in the third metal layer M3 on the active matrix substrate 103.

On the active matrix substrate 103, a channel light shielding layer 3 is formed in the first metal layer M1, the gate wiring lines GL (and the gate electrode GE) is formed in the second metal layer M2, and the source wiring lines SL (and the source electrode SE) and a drain electrode DE are formed in the third metal layer M3. That is, the source wiring lines SL are in an upper layer than the oxide semiconductor layer 7 of the pixel TFTs 20. At a source contact portion, the source wiring lines SL (here, the first wide width portion E1) are formed in an upper insulating layer 11 and a source-side opening 11s formed in the upper insulating layer 11 and come into contact with the oxide semiconductor layer 7 in the source-side opening 11s. The other configurations may be similar to those of the display device 1001.

Third Modification Example

Figure 6:
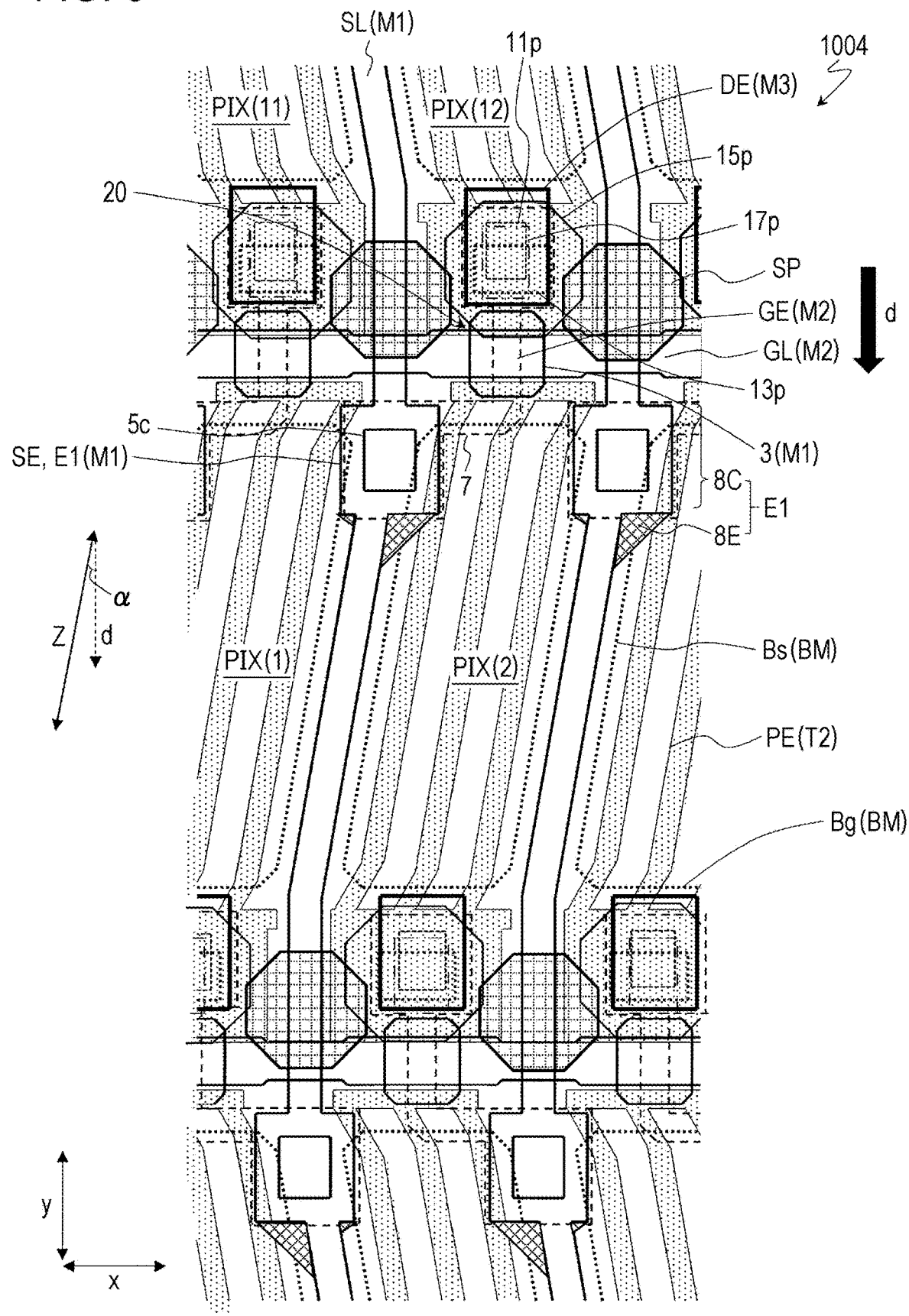
FIG. 6 is a schematic plan view of a display device 1004 according to a third modification example.

FIG. 6 is a plan view exemplifying a display device 1004 according to a third modification example.

The display device 1004 is different from the display device 1001 in that the first wide width portion E1 includes a contact part 8C and an expanded part 8E. The expanded part 8E is formed on the side of the first direction d of the contact part 8C, for example. As described above with reference to FIG. 2B, since the expanded part 8E includes a part that does not overlap with the black matrix BM and overlaps with the spacer shadow region Rs, it is possible to further reduce the influences of the second alignment failure region R2.

Fourth Modification Example

Figure 7:
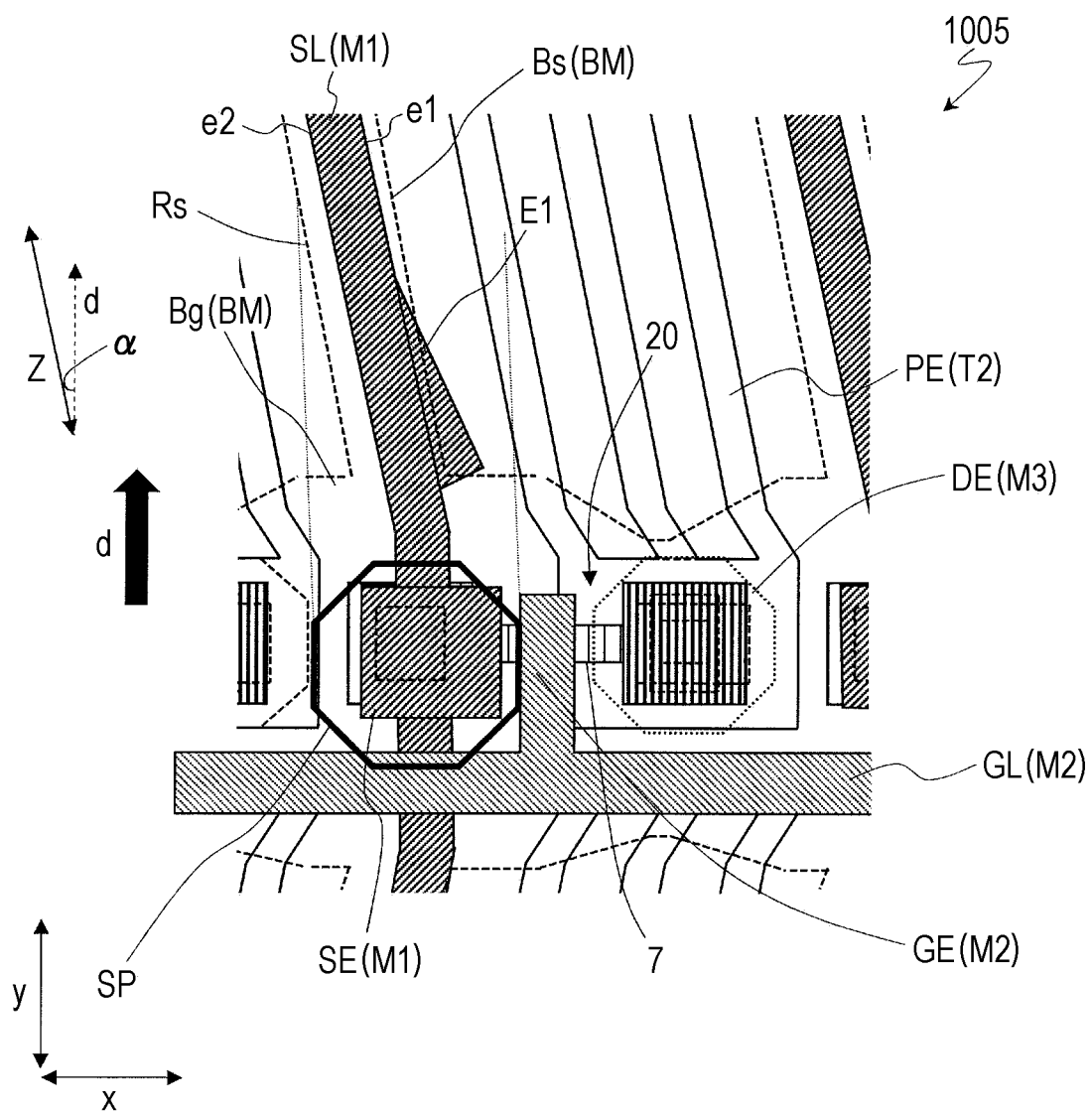
FIG. 7 is a schematic plan view of a display device 1005 according to a fourth modification example.

FIG. 7 is a plan view illustrating a part of a display device 1005 according to a fourth modification example.

The display device 1005 is different from the display device 1001 in that the pixel TFTs 20 are disposed such that a channel length direction follows the direction x (TFT transverse placement structure).

The black matrix BM may be disposed such that the entire pixel TFTs 20 and the entire spacers SP are shielded from light. That is, the entire pixel TFTs 20 and the entire spacers SP may overlap with the black matrix BM when seen in the normal line direction of the main surface 1S of the substrate 1. The first wide width portion E1 of the source wiring line SL is disposed on the side of the first direction d of each spacer SP even in the TFT transverse placement structure as well. The first wide width portion E1 may be provided only at the edge e1 of the source wiring line SL on the first side and may not be formed at the edge e2 on the second side.

With this structure, it is possible to curb enlargement of the width of the source wiring line light shielding portion Bs of the black matrix BM and to curb degradation of display properties due to the spacer SP. Note that in the structure, the first wide width portion E1 does not function as the source electrode of the pixel TFT 20 and functions as a light shielding layer of the second alignment failure region R2.

Fifth Modification Example

In the embodiment, it is only necessary for the first wide width portion E1 to be disposed in the vicinity of at least one spacer SP and on the side of the first direction d, for example. The disposition of the spacers SP is not particularly limited. Although the spacers SP are disposed at all the intersections between the gate wiring lines GL and the source wiring lines SL in the example illustrated in FIG. 3A, the spacers SP may be disposed only in the vicinity of some of the intersections and may not be disposed in the vicinity of the other intersections. Also, the spacers SP may not be disposed in the vicinity of the intersections.

Each source wiring line SL may have a plurality of wide width portions that function as source electrodes of a pixel TFT 101, and only some of these wide width portions may be the first wide width portions E1 disposed so as to overlap with at least a part of the spacer shadow region Rs in the vicinity of the spacers SP. The spacers SP may not be disposed in the vicinity of the other wide width portions (referred to as "second wide width portions E2"). In such a case, the entire second wide width portions E2 may overlap with the black matrix BM when seen in the normal line direction of the main surface 1S of the substrate 1. Alternatively, the second wide width portions E2 may have a part that does not overlap with the black matrix BM such that the area thereof is smaller than the area of the non-overlapping region of the first wide width portions E1.

Further, a plurality of main spacers and a plurality of sub spacers with a size that is smaller than that of the main spacers may be provided in the display device according to the embodiment. In this case, the first wide width portions E1 may be formed in the vicinity of the main spacers and on the side of the first direction d while no first wide width portions E1 may be formed in the vicinity of the sub spacers. For example, each source wiring line SL may have no wide width portions or may have the second wide width portions E2 in the vicinity of the sub spacers.

Figure 8:
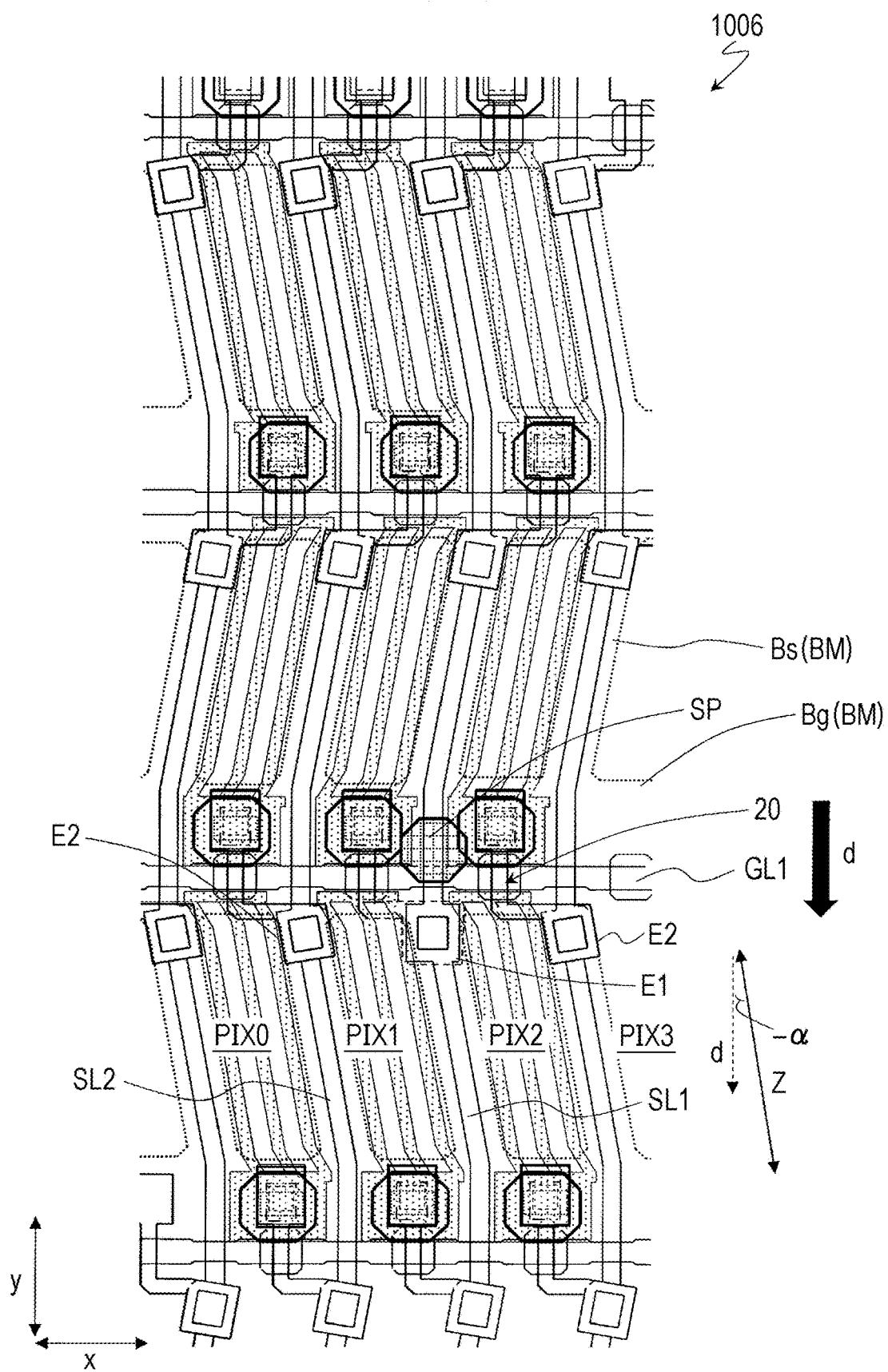
FIG. 8 is a schematic plan view of a display device 1006 according to a fifth modification example.
Figure 9:
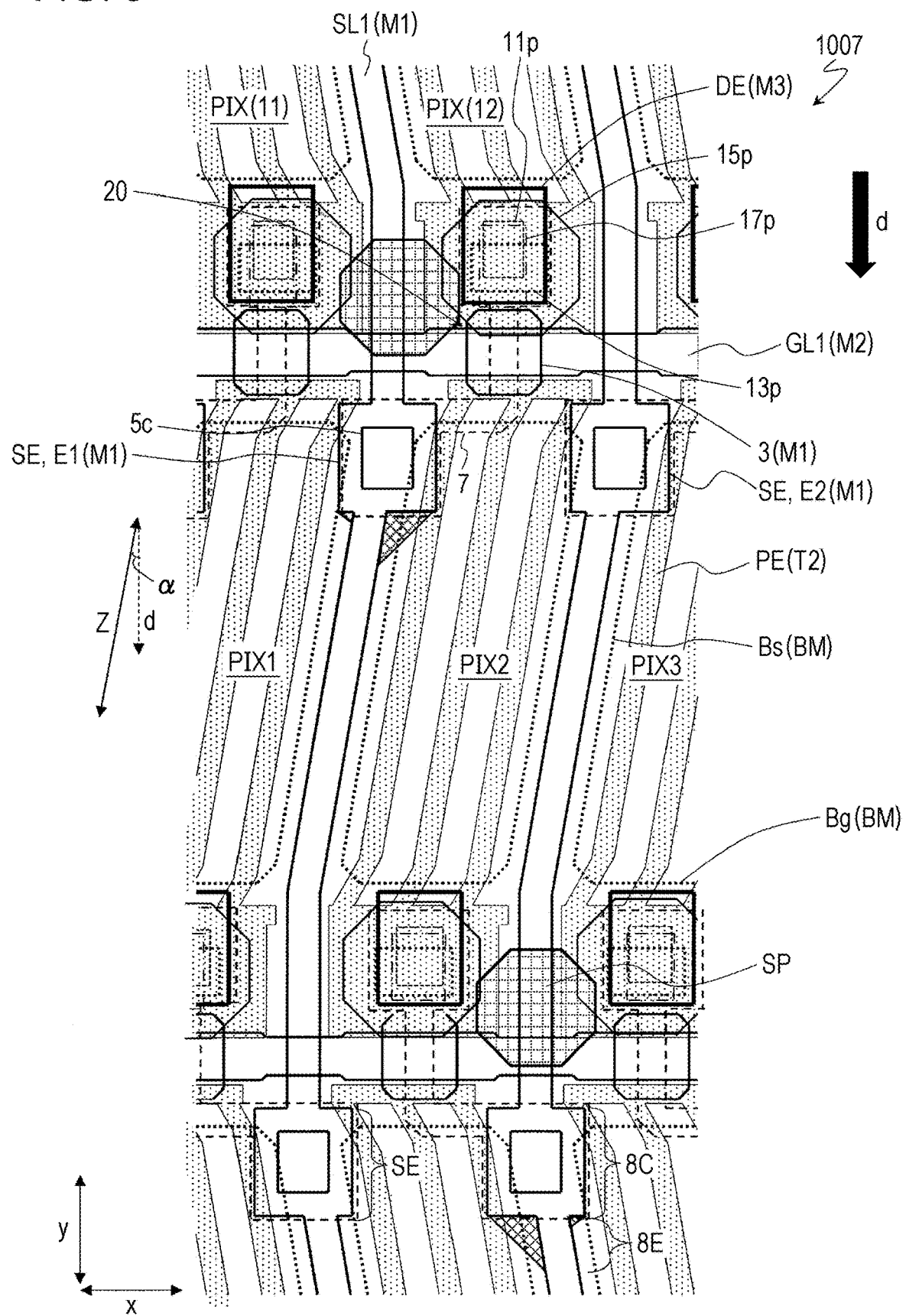
FIG. 9 is a schematic plan view of a display device 107 according to the fifth modification example.

FIGS. 8 and 9 are plan views illustrating display devices 1006 and 1007 according to the fifth modification example, respectively.

In the display devices 1006 and 1007, the spacers SP (each of which is a main spacer or a sub spacer) are formed at only some of a plurality of intersections at which the source wiring lines SL and the gate wiring lines GL intersect with each other. The first wide width portions E1 are formed at the source wiring lines SL in the vicinity of the spacers SP and in regions located on the side of the first direction d. The first wide width portions E1 function as light shielding portions that shield the second alignment failure region R2 from light and are used for connection to the oxide semiconductor layer 7 (configures the source contact portion). Meanwhile, other wide width portions ("second wide width portions") E2 used for connection to the oxide semiconductor layer 7 are formed at the source wiring lines SL in the vicinity of the intersections at which no spacers SP are disposed.

In these examples, a spacer SP is disposed in the vicinity of the intersections between the source wiring line SL1 and the gate wiring line GL1. Here, the two pixel regions that are located on the side of the first direction d of the gate wiring line GL1 and are adjacent to each other with the source wiring line SL1 interposed therebetween are define as "pixel regions PIX(1) and PIX(2)" (a first pixel region and a second pixel region). The source wiring line SL1 has a first wide width portion E1 located in the vicinity of the spacer SP between the two pixel regions PIX(1) and PIX(2).

Meanwhile, another wide width portion (second width portion) E2 that is different from the first wide width portion E1 is formed between other two adjacent pixel regions (also referred to as a third pixel region and a fourth pixel region). Note that at least one of the third pixel region and the fourth pixel region may be different from the first pixel region and the second pixel region. The source wiring line SL has the second wide width portion E2 between the third pixel region and the fourth pixel region (for example, between the pixel region PIX(0) and the pixel region PIX(1), between the pixel region PIX(2) and the pixel region PIX(3), and the like).

Both the first wide width portion E1 and the second wide width portion E2 have wide widths than the width of the source wiring line SL. The first wide width portion E1 and the second wide width portion E2 may have mutually different areas (sizes) and/or mutually different shapes or may have different disposition relationships (sizes of non-overlapping regions) with respect to the black matrix BM). For example, the entire second wide width portion E2 may overlap with the black matrix BM. Alternatively, the area (size) of a part of the second wide width portion E2 that does not overlap with the black matrix BM may be smaller than the area of the non-overlapping region of the first wide width portion E1. In this manner, it is possible to minimize a proportion of the light shielding region that occupies the display region, to secure a pixel aperture ratio, and to curb degradation of display properties due to the spacers SP.

In the example illustrated in FIG. 8, the first wide width portion E1 is asymmetric with respect to the center line of the source wiring line SL1 at which the first wide width portion E1 is formed, and the second wide width portion E2 is symmetric with respect to the center line of the source wiring line SL2 at which the second wide width portion E2 is formed. The first wide width portion E1 may have an edge extending with an inclination with respect to the source wiring line SL (substantially parallel to the first direction d, for example), and the second wide width portion E2 may have an edge extending substantially parallel to the source wiring line SL (substantially parallel to the direction Z).

Although both the first wide width portion E1 and the second wide width portion E2 have rectangular shape in the example illustrated in FIG. 8, one or both of these may not have rectangular shapes. Also, the length of the first wide width portion E1 in the first direction d may be longer than the length of the second wide width portion E2 in the first direction d. As illustrated in FIG. 9, for example, the first wide width portion E1 may include the contact part 8C and the expanded part 8E, and the second wide width portion E2 may configured only of the contact part 8C.

Although the pixel TFTs 20 have a top gate structure in the display device exemplified above, the pixel TFTs 20 may have a bottom gate structure including the gate electrode on the semiconductor layer on the side of the substrate. Alternatively, the pixel TFTs 20 may have a double-gate structure that has gate electrodes above the semiconductor layer and on the side of the substrate. For example, a conductive layer that functions as a lower gate electrode of the pixel TFTs 20 may be formed in the first metal layer M1 located on the oxide semiconductor layer 7 on the side of the substrate 1. The lower gate electrode also functions as a channel light shielding film. The lower gate electrode may be electrically connected to the gate wiring lines GL or may be connected to a fixe potential (for example, the source wiring lines SL).

The display device according to the embodiment may be a display device in an FFS mode or an IPS mode, for example. The FFS mode is a mode of a transverse direction electric field scheme in which a pair of electrodes are provided on one of the substrates and an electric field is applied to liquid crystal molecules in a direction that is parallel to the substrate surfaces (transverse direction). In this example, an electric field represented by a line of electric force exiting the pixel electrode PE, passing through the liquid crystal layer (not illustrated), further passing through the slit-shaped opening in the pixel electrode PE, and getting out to the common electrode CE is generated. The electric field has a component in the transverse direction with respect to the liquid crystal layer. As a result, it is possible to apply an electric field in the transverse direction to the liquid crystal layer. The transverse direction electric field scheme has an advantage that a wider view angle than that of a vertical direction electric field scheme can be realized since no liquid crystal molecules stand up from the substrate.

The electrode structure in which the pixel electrode PE above the common electrode CE with the dielectric layer 17 interposed therebetween is described in WO 2012/086513, for example. Note that the common electrode CE may be disposed above the pixel electrode PE with the dielectric layer 17 interposed therebetween. That is, the pixel electrode PE may be formed on the lower transparent conductive layer T1, and the common electrode CE may be formed on the upper transparent conductive layer T2. Such an electrode structure is described in Japanese Unexamined Patent Application Publication Nos. 2008-032899 and 2010-008758, for example. The entire content disclosed in WO 2012/086513 and Japanese Unexamined Patent Application Publication Nos. 2008-032899 and 2010-008758 will be incorporated in the specification for reference.

<Method for Manufacturing Active Matrix Substrate 101>

Figure 10:
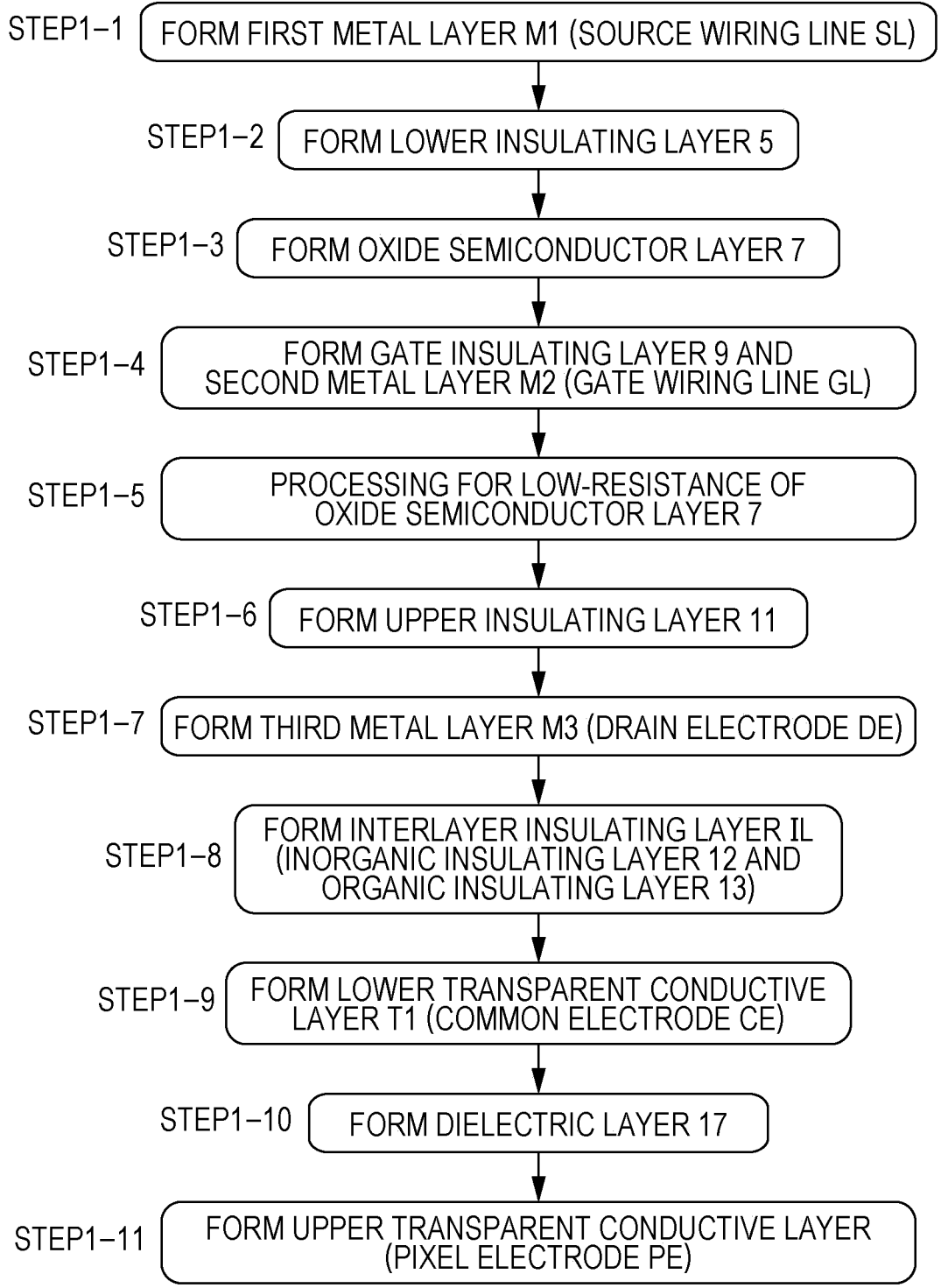
FIG. 10 is a flowchart illustrating an example of a method for manufacturing the active matrix substrate 101.

Hereinafter, an example of a method for manufacturing the active matrix substrate according to the embodiment will be described by exemplifying the active matrix substrate 101 with reference to FIGS. 3A to 3C again. FIG. 10 is a flowchart illustrating an example of a method for manufacturing the active matrix substrate 101.

Step 1-1

First, the first metal layer M1 including the source wiring lines SL with the first wide width portions E1 and the channel light shielding layer 3 is formed on the substrate 1.

As the substrate 1, a glass substrate, a silicon substrate, a plastic substrate with heat resistance (resin substrate), or the like can be used.

The first metal layer M1 is obtained by forming a first conductive film (thickness: equal to or greater than 50 nm and equal to or less than 500 nm, for example) by a sputtering method, for example, and performing patterning on the first conductive film.

For example, it is possible to use, as the first conductive film, a metal film containing an element selected from aluminum (Al), chromium (Cr), copper (Cu), tantalum (Ta), titanium (Ti), molybdenum (Mo), or tungsten (W), an alloy film containing these elements as constituents, or the like. Also, a laminated film including a plurality of films among these may be used. For example, it is possible to use a laminated film with a three-layer structure of a titanium film-an aluminum film-a titanium film or a three-layer structure of a molybdenum film-an aluminum film-a molybdenum film. Note that the structure of the first conductive film is not limited to the three-layer structure, and the first conductive film may have a single layer or two-layer structure or a laminated structure of four or more layers. Here, a laminated film including a Ti film (thickness: 15 to 70 nm) as a lower layer and including a Cu film (thickness: 200 to 400 nm) as an upper layer is used as the first conductive film.

Step 1-2

Then, the lower insulating layer 5 (thickness: equal to or greater than 200 nm and equal to or less than 600 nm, for example) that covers the first metal layer M1 is formed. Thereafter, patterning is performed on the lower insulating layer 5 to form the source-side opening 5s that causes some of the first wide width portions E1 to be exposed.

As the lower insulating layer 5, it is possible to appropriately use a silicon oxide ($SiO_2$) layer, a silicon nitride (SiNx) layer, a silicon oxynitride (SiOxNy; x>y) layer, a silicon nitride oxide (SiNxOy; x>y) layer, an aluminum oxide layer, a tantalum oxide layer, or the like. The lower insulating layer 5 may have a laminated structure. Here, a laminated film including a silicon nitride (SiNx) layer (thickness: 50 to 600 nm) as a lower layer and a silicon oxide ($SiO_2$) layer (thickness: 50 to 600 nm) as an upper layer is formed as the lower insulating layer 5 using the CVD method, for example. If an oxide layer such as silicon oxide film is used as the lower insulating layer 5 (as the uppermost layer in a case in which the lower insulating layer 5 has a laminated structure), it is possible to reduce, by the oxide film, oxidation deficiency generated in the channel region in the oxide semiconductor layer formed later and thereby to curb a decrease in resistance in the channel region.

Step 1-3

Then, the oxide semiconductor film (thickness: equal to or greater than 15 nm and equal to or less than 200 nm, for example) is formed on the lower insulating layer 5 and in the source-side opening 5s using the sputtering method, for example, and patterning is then performed on the oxide semiconductor film to form the oxide semiconductor layer 7 of the pixel TFTs 20. Although the oxide semiconductor film is not particularly limited, the oxide semiconductor film may be an In—Ga—Zn—O-based semiconductor film, for example. The oxide semiconductor layer 7 is electrically connected to the source wiring lines SL (here, the first wide width portions E1) in the source-side opening 5s.

Step 1-4

Next, the insulating film (thickness: equal to or greater than 80 nm and equal to or less than 250 nm, for example) and the second conductive film (thickness: equal to or greater than 50 nm and equal to or less than 500 nm, for example) are formed in this order so as to cover the oxide semiconductor layer 7. The second conductive film may be formed using the sputtering method, for example, and the insulating film may be formed using the CVD method, for example.

As the insulating film, an insulating film similar to the lower insulating layer 5 (the insulating film exemplified as the lower insulating layer 5) can be used. If an oxide film such as a silicon oxide film is used as the insulating film, it is possible to reduce, by the oxide film, oxidation deficiency generated in the channel region of the oxide semiconductor layer 7 and thereby to curb a decrease in resistance in the channel region. As the second conductive film, it is possible to use a conductive film that is similar to the first conductive film. Here, a silicon oxide ($SiO_2$) film is used as the insulating film. As the second conductive film, a laminated film including a Ti film (thickness: 15 to 70 nm) as a lower layer and a Cu film (thickness: 200 to 400 nm) as an upper layer, for example, is used.

Then, patterning is performed on the second conductive film using a resist mask, which is not illustrated in the drawing, to form the gate wiring lines GL (including the portions that serve as the gate electrodes GE of the pixel TFTs 20). The patterning on the second conductive film can be performed by wet etching or dry etching.

Thereafter, patterning is performed on the insulating film using the aforementioned resist mask. Alternatively, patterning may be performed on the insulating film using the gate wiring lines GL as a mask after removing the aforementioned resist mask. In this manner, the gate insulating layer 9 of the pixel TFTs 20 is obtained. The patterning of the insulating film can be performed by dry etching, for example.

Note that a surface layer portion of a part of the lower insulating layer 5 that is not covered with the oxide semiconductor layer 7 may be etched (overetched) in some cases during the patterning of the insulating film.

Since the patterning of the insulating film and the upper second conductive film is performed using the same mask in this process, the side surface of the gate insulating layer 9 and the side surface of the gate wiring lines GL are matched in the thickness direction. That is, a peripheral edge of the gate insulating layer 9 and a peripheral edge of the gate wiring lines GL are matched when seen in the normal line direction of the main surface 1S of the substrate 1.

Step 1-5

Next, low-resistance processing of the oxide semiconductor layer 7 is performed. As the low-resistance processing, plasma processing may be performed, for example. In this manner, a region of the oxide semiconductor layer 7 that does not overlap with the gate wiring lines GL and the gate insulating layer 9 is a low-resistant region with a lower specific resistance than a region that overlaps with the gate wiring lines GL and the gate insulating layer 9 when seen in the normal line direction of the main surface 1S of the substrate 1. The low-resistant region may be a conductive region (for example, seat resistance: equal to or less than 200 Ω/square).

In the low resistance processing (plasma processing), a part of the oxide semiconductor layer 7 that is not covered with the gate wiring lines GL or the gate insulating layer 9 may be exposed to reducing plasma or plasma (for example, argon plasma) containing a doping element. In this manner, the resistance in the vicinity of the surface of the part of the oxide semiconductor layer 7 that is exposed decreases, and the part becomes a low-resistance region. A part of the oxide semiconductor layer 7 that is masked with the gate wiring lines GL or the gate insulating layer 9 remains as a semiconductor region. Note that a method, conditions, and the like of the low resistance processing are described in Japanese Unexamined Patent Application Publication No. 2008-40343. The entire content disclosed in Japanese Unexamined Patent Application Publication No. 2008-40343 will be incorporated in the specification for reference.

Step 1-6

Next, the upper insulating layer 11 that covers the oxide semiconductor layer 7, the gate insulating layer 9, and the gate electrode GE is formed. The upper insulating layer 11 can be formed using a single inorganic layer or laminating inorganic insulating layers such as a silicon oxide film, a silicon nitride film, a silicon oxynitride film, or a silicon nitride oxide film. The thickness of the inorganic insulating layer may be equal to or greater than 100 nm and equal to or less than 500 nm. The upper insulating layer 11 is preferably formed using an insulating film that reduces the oxide semiconductors, such as a silicon nitride film, since it is possible to maintain a low specific resistance in a region (here, the low-resistance region) of the oxide semiconductor layer 7 that comes into contact with the upper insulating layer 11. Here, an SiNx layer (thickness: 300 nm), for example, is formed by the CVD method as the upper insulating layer 11.

Thereafter, the drain-side opening 11d that reaches the oxide semiconductor layer 7 is formed in the upper insulating layer 11 through dry etching, for example.

Step 1-7

Next, the third metal layer M3 including the drain electrode DE is formed on the upper insulating layer 11. Here, the third conductive film (thickness: equal to or greater than 50 nm and equal to or less than 500 nm, for example) is formed on the upper insulating layer 11 and in the drain-side opening 11d, and patterning is performed on the third conductive film to obtain the drain electrode DE. The patterning can be performed by dry etching or wet etching. In this manner, the pixel TFTs 20 are obtained.

As the third conductive film, it is possible to use an element selected from aluminum (Al), chromium (Cr), copper (Cu), tantalum (Ta), titanium (Ti), molybdenum (Mo), and tungsten (W), an alloy containing these elements as constituents, or the like. For example, the third conductive film may have a three-layer structure of a titanium film-an aluminum film-a titanium film, a three-layer structure of a molybdenum film-an aluminum film-a molybdenum film, or the like. Note that the structure of the third conductive film is not limited to the three-layer structure, and the third conductive film may have a single layer or two-layer structure or a laminated structure of four or more layers. Here, a laminated layer including a Ti film (thickness: 15 to 70 nm) as a lower layer and a Cu film (thickness: 200 to 400 nm) as an upper layer is used.

Step 1-8

Next, the interlayer insulating layer IL is formed so as to cover the pixel TFTs 20. Here, the inorganic insulating layer (thickness: equal to or greater than 100 nm and equal to or less than 400 nm, for example) 12 and the organic insulating layer (thickness: 1 to 3 µm or preferably 2 to 3 µm, for example) 13 are formed in this order as the interlayer insulating layer IL. The material of the inorganic insulating layer 12 may be the same as the material exemplified as the material of the upper insulating layer 11. Here, an SiNx layer (thickness: 200 nm, for example) is formed by the CVD method as the inorganic insulating layer 12. The organic insulating layer 13 may be an organic insulating film containing a photosensitive resin material, for example. Thereafter, patterning is performed on the organic insulating layer 13 to form the opening 13p.

Step 1-9

Next, the lower transparent conductive layer T1 including the common electrode CE is formed.

First, a first transparent conductive film (thickness: 20 to 300 nm) is formed on the interlayer insulating layer IL and in the opening 13p. Here, an indium-zinc oxide film is formed as the first transparent conductive film by the sputtering method, for example. As a material of the first transparent electrode film, it is possible to use metal oxide such as indium-tin oxide (ITO), indium-zinc oxide, or ZnO. Thereafter, patterning is performed on the first transparent conductive film by wet etching, for example. In this manner, the common electrode CE is obtained. In this example, the common electrode CE is disposed substantially over the entire display region. However, the common electrode CE has an opening 15p in a region in which the pixel contact hole is formed. In this example, a part of the first transparent conductive film that is located in the opening 13p is removed. Note that a shielding layer that covers a part or all of peripheral circuits may be formed using the first transparent conductive film.

Step 1-10

Next, the dielectric layer (thickness: 50 to 500 nm) 17 is formed on the interlayer insulating layer IL and the common electrode CE and in the opening 13p. The material of the dielectric layer 17 may be the same as the material exemplified as the material of the inorganic insulating layer 12. Here, an SiN film is formed by the CVD method, for example, as the dielectric layer 17.

Thereafter, etching is performed on the dielectric layer 17 and the inorganic insulating layer 12 (a part of the inorganic insulating layer 12 that is located in the opening 13p) to form the opening 17p that reaches a part of the oxide semiconductor layer 7. The opening 17p may be disposed so as to at least partially overlap with the opening 13p when seen in the normal line direction of the main surface 1S of the substrate 1. In this manner, the pixel contact hole configured of the opening 13p in the organic insulating layer 13 and the opening 17p in the dielectric layer 17 is obtained.

Step 1-11

Next, the upper transparent conductive layer T2 including the pixel electrode PE is formed.

Specifically, the second transparent conductive film (thickness: 20 to 300 nm) is formed on the dielectric layer 17 and in the pixel contact hole first. Thereafter, patterning is performed on the second transparent conductive film to form the pixel electrode PE on the dielectric layer 17. The pixel electrode PE is provided with at least one opening (or a notch) for each pixel.

The material of the second transparent conductive film may be the same as the materials exemplified as the material of the first transparent conductive film. The second transparent conductive film may be a single layer or a laminated film. Here, an indium-zinc oxide film is formed by the sputtering method, for example. A part of the pixel electrode PE may be disposed so as to overlap with the common electrode CE with the dielectric layer 17 interposed therebetween to configure an auxiliary capacitor. In this manner, the active matrix substrate 101 is manufactured. Thereafter, the display device 1001 is obtained by a known method using the active matrix substrate 101.

The active matrix substrates according to the aforementioned modification examples may also be manufactured by methods similar to that described above by appropriately changing patterns and the like for the respective conductive layers M1 to M3, T1, and T2.

Note that in a case in which the spacers SP are provided on the side of the active matrix substrate, the effect that it is possible to curb degradation of display properties such as light leakage due to an alignment failure can be achieved regardless of the shape of the black matrix BM as long as the source wiring lines on the active matrix substrate have the first wide width portions E1. The structure of the active matrix substrate may be the structure exemplified in FIGS. 3A to 9.

Even in a case in which the entire first wide width portions E1 overlap with the black matrix BM, for example, it is possible to more reliably curb light leakage by shielding the alignment failure region R2 from light with both the black matrix BM and the first wide width portions E1. However, it is possible to curb a decrease in pixel aperture ratio and to curb light leakage due to the alignment failure by disposing the first wide width portions E1 and the black matrix BM so as to partially overlap with each other.

(Concerning Oxide Semiconductor)

Although the oxide semiconductor TFTs are used as the pixel TFTs 20 in the above description, the pixel TFTs 20 may be amorphous silicon TFTs or crystalline silicon TFTs.

In a case in which the oxide semiconductor TFTs are used as the pixel TFTs 20, the oxide semiconductors included in the oxide semiconductor layer 7 may be amorphous oxide semiconductors or may be crystalline oxide semiconductors with crystalline parts. As the crystalline oxide semiconductors, polycrystal oxide semiconductors, microcrystalline oxide semiconductors, crystalline oxide semiconductors with a c axis oriented substantially vertical to the layer surface, and the like are exemplified.

The oxide semiconductor layer 7 may have a laminated structure of two or more layers. In the case in which the oxide semiconductor layer 7 has a laminated structure, the oxide semiconductor layer 7 may include an amorphous oxide semiconductor layer and a crystalline oxide semiconductor layer. Alternatively, the oxide semiconductor layer 7 may include a plurality of crystalline oxide semiconductor layers with different crystal structures. Also, the oxide semiconductor layer 7 may include a plurality of amorphous oxide semiconductor layers. In a case in which the oxide semiconductor layer 7 has a two-layer structure including an upper layer and a lower layer, an energy gap of oxide semiconductors included in a layer located on the side of the gate electrode in the two layers (the lower layer in a bottom gate structure or the upper layer in a top gate structure) may be smaller than an energy gap of oxide semiconductors included in a layer located on the side opposite to the gate electrode (the upper layer in the bottom gate structure or the lower layer in the top gate structure). However, in a case in which a difference between the energy gaps in these layers is relatively small, the energy gap of the oxide semiconductors in the layer located on the side of the gate electrode may be greater than the energy gap of the oxide semiconductors in the layer located on the side opposite to the gate electrode.

Materials, structures, film formation methods of the amorphous oxide semiconductors and the aforementioned respective crystalline oxide semiconductors, a configuration of the oxide semiconductor layer with a laminated structure, and the like are described in Japanese Unexamined Patent Application Publication No. 2014-007399, for example. The entire content disclosed in Japanese Unexamined Patent Application Publication No. 2014-007399 will be incorporated in the specification for reference.

The oxide semiconductor layer 7 may include at least one kind of metal element from among In, Ga, and Zn, for example. In the embodiment, the oxide semiconductor layer 7 includes In—Ga—Zn—O-based semiconductors (for example, indium gallium zinc oxide), for example. Here, each In—Ga—Zn—O-based semiconductor is a ternary oxide of In (indium), Ga (gallium), and Zn (zinc), a proportion (composition ratio) of In, Ga, and Zn is not particularly limited and includes, for example, In:Ga:Zn=2:2:1, In:Ga:Zn=1:1:1, In:Ga:Zn=1:1:2, or the like. Such an oxide semiconductor layer 7 is formed of an oxide semiconductor film including In—Ga—Zn—O-based semiconductors.

The In—Ga—Zn—O-based semiconductors may be amorphous semiconductors or crystalline semiconductors. The crystalline In—Ga—Zn—O-based semiconductors are preferably crystalline In—Ga—Zn—O-based semiconductors with a c axis oriented substantially vertical to the layer surface.

Note that crystal structures of the crystalline In—Ga—Zn—O-based semiconductors are disclosed, for example, Japanese Unexamined Patent Application Publication No. 2014-007399 described above, Japanese Unexamined Patent Application Publication Nos. 2012-134475 and 2014-209727. The entire content disclosed in Japanese Unexamined Patent Application Publication Nos. 2012-134475 and 2014-209727 will be incorporated in the specification for reference. Since the TFTs that have the In—Ga—Zn—O-based semiconductor layers have high mobility (over 20 times the mobility of a-Si TFTs) and a low leaking current (less than 1/100 of that of a-Si TFTs), the TFTs are suitably used as drive TFTs (TFTs included in a drive circuit provided in the periphery of the display region including a plurality of pixels and on the same substrate as that of the display region) and pixel TFTs (TFTs provided at the pixels).

The oxide semiconductor layer 7 may include other oxide semiconductors instead of the In—Ga—Zn—O-based semiconductors. For example, the oxide semiconductor layer 7 may include In—Sn—Zn—O-based semiconductors (for example, $In_2O_3$—$SnO_2$—ZnO; InSnZnO). The In—Sn—Zn—O-based semiconductors are ternary oxide of In (indium), Sn (tin), and Zn (zinc). Alternatively, the oxide semiconductor layer 7 may include In—Al—Zn—O-based semiconductors, In—Al—Sn—Zn—O-based semiconductors, Zn—O-based semiconductors, In—Zn—O-based semiconductors, Zn—Ti—O-based semiconductors, Cd—Ge—O-based semiconductor, Cd—Pb—O-based semiconductors, CdO (cadmium oxide), Mg—Zn—O-based semiconductors, In—Ga—Sn—O-based semiconductors, In—Ga—O-based semiconductors, Zr—In—Zn—O-based semiconductors, Hf—In—Zn—O-based semiconductors, Al—Ga—Zn—O-based semiconductors, Ga—Zn—O-based semiconductors, In—Ga—Zn—Sn—O-based semiconductors or the like.

What is claimed is:

1. A display device comprising:
a plurality of pixel regions;
an active matrix substrate;
a counter substrate that faces the active matrix substrate; and
a liquid crystal layer disposed between the active matrix substrate and the counter substrate,
wherein the active matrix substrate has a substrate, a plurality of pixel TFTs that are supported on a main surface of the substrate and are provided such that each of the pixel TFTs corresponds to one of the plurality of pixel regions, a plurality of gate wiring lines that supply a gate signal to the plurality of pixel TFTs, and a plurality of source wiring lines that supply a source signal to the plurality of pixel TFTs, extend in a direction that intersects with the plurality of gate wiring lines, and have a first width,
one of the active matrix substrate and the counter substrate includes an alignment film, which is disposed in contact with the liquid crystal layer and defines an initial alignment axis azimuth of liquid crystal molecules in the liquid crystal layer, on which rubbing processing is performed in a first direction that is parallel to the initial alignment axis azimuth, and a plurality of spacers that are disposed between the active matrix substrate and the counter substrate and define an interval between the active matrix substrate and the counter substrate,
the display device further comprises a black matrix that includes a plurality of gate wiring line light shielding portions and a plurality of source wiring line light shielding portions, each of the plurality of gate wiring line light shielding portions extends to be parallel to corresponding one of the plurality of gate wiring lines, and each of the plurality of source wiring line light shielding portions extends to be parallel to corresponding one of the plurality of source wiring lines, when seen in a normal line direction of the main surface of the substrate,
the plurality of pixel regions include a first pixel region and a second pixel region that are adjacent to each other, and the plurality of source wiring lines include a first source wiring line located between the first pixel region and the second pixel region, and
between the first pixel region and the second pixel region, the first source wiring line has a first wide width portion with a second width that is greater than the first width, the first wide width portion being disposed in a vicinity of one of the plurality of spacers, the first wide width portion including an overlapping region that overlaps with the black matrix and a non-overlapping region that does not overlap with the black matrix when seen in the normal line direction of the main surface of the substrate,
a spacer shadow region extending from the one spacer to a side of the first direction with an identical width with a width of the one spacer includes a first region that overlaps with the black matrix and a second region that does not overlap with the black matrix when seen in the normal line direction of the main surface of the substrate, and
the non-overlapping region of the first wide width portion at least partially overlaps with the second region of the spacer shadow region.

2. The display device according to claim 1,
wherein the first source wiring line forms an angle of equal to or greater than 2° and equal to or less than 30° with respect to the first direction between the first pixel region and the second pixel region.

3. The display device according to claim 1,
wherein the first wide width portion is asymmetric with respect to a center line of the first source wiring line when seen in the normal line direction of the main surface of the substrate.

4. The display device according to claim 1,
wherein a center line of the first source wiring line extends across the spacer shadow region, and a part of the spacer shadow region located on a first side of the center line is greater than a part located on a second side when seen in the normal line direction of the main surface of the substrate.

5. The display device according to claim 4,
wherein a part of the first wide width portion located on the first side of the center line is greater than a part located on the second side when seen in the normal line direction of the main surface of the substrate.

6. The display device according to claim 4,
wherein the non-overlapping region of the first wide width portion is located only on the first side of the first source wiring line when seen in the normal line direction of the main surface of the substrate.

7. The display device according to claim 4,
wherein the non-overlapping region of the first wide width portion is located on both sides of the first source wiring line, and a first part, of the non-overlapping region, located on the first side of the first source wiring line is greater than a second part located on the second side of the first source wiring line when seen in the normal line direction of the main surface of the substrate.

8. The display device according to claim 1,
wherein the first wide width portion and a semiconductor layer of each of the pixel TFTs overlap with each other with an insulating layer between the first wide width portion and the semiconductor layer, and
a part of the first wide width portion and a part of the semiconductor layer are in contact with each other in a contact hole formed in the insulating layer.

9. The display device according to claim 8,
wherein the first wide width portion includes a contact part including a region that is in contact with the semiconductor layer and an expanded part that extends from the contact part to the side of the first direction with a smaller width than a width of the contact part, and
at least a part of the expanded part does not overlap with the black matrix and overlaps with the spacer shadow region when seen in the normal line direction of the main surface of the substrate.

10. The display device according to claim 1,
wherein the plurality of pixel regions further include a third pixel region and a fourth pixel region that are adjacent to each other,
at least one of the third pixel region and the fourth pixel region is different from the first pixel region and the second pixel region,
the plurality of source wiring lines include a second source wiring line located between the third pixel region and the fourth pixel region,
the second source wiring line further includes a second wide width portion with a wider width than the first width between the third pixel region and the fourth pixel region, and
the second wide width portion entirely overlaps with the black matrix, or a region of the second wide width portion that does not overlap with the black matrix is smaller than the non-overlapping region of the first wide width portion when seen in the normal line direction of the main surface of the substrate.

11. The display device according to claim 10,
wherein no spacer is disposed in a vicinity of the second wide width portion and on a side of the second wide width portion opposite to the first direction,
the first wide width portion is asymmetric with respect to a center line of the first source wiring line, and
the second wide width portion is symmetric with respect to a center line of the second source wiring line.

12. The display device according to claim 10,
wherein the first wide width portion has an edge portion extending in the first direction, and
the second wide width portion has an edge portion extending parallel to the second source wiring line.

13. The display device according to claim 10,
wherein a length of the first wide width portion in the first direction is greater than a length of the second wide width portion in the first direction.

14. The display device according to claim 1,
wherein the pixel TFTs include semiconductor layers and gate electrodes disposed above the semiconductor layers, and
the plurality of source wiring lines are disposed in the semiconductor layers of the pixel TFTs on a side of the substrate.

15. The display device according to claim 14,
wherein the pixel TFTs further include other gate electrodes or light shielding films in the semiconductor layers on the side of the substrate, and
the other gate electrodes or the light shielding films are formed of conductive films that are identical with the plurality of source wiring lines.

16. The display device according to claim 1,
wherein the plurality of spacers and the alignment film are provided on the active matrix substrate.

17. The display device according to claim 1,
wherein the plurality of spacers and the alignment film are provided on the counter substrate.

18. The display device according to claim 1,
wherein the pixel TFTs include oxide semiconductor layers that have channel regions.

19. An active matrix substrate that has a plurality of pixel regions, the active matrix substrate comprising:
a substrate;
a plurality of pixel TFTs that are supported on a main surface of the substrate and are provided such that each of the pixel TFTs corresponds to one of the plurality of pixel regions;
a plurality of gate wiring lines that supply a gate signal to the plurality of pixel TFTs;
a plurality of source wiring lines that supply a source signal to the plurality of pixel TFTs, extend in a direction that intersects with the plurality of gate wiring lines, and have a first width;
an alignment film, which defines an initial alignment axis azimuth of liquid crystal molecules, on which rubbing processing is performed in a first direction that is parallel to the initial alignment axis azimuth; and a plurality of spacers,
wherein the plurality of pixel regions include a first pixel region and a second pixel region that are adjacent to each other, and the plurality of source wiring lines include a first source wiring line located between the first pixel region and the second pixel region,
between the first pixel region and the second pixel region,
the first source wiring line has a first wide width portion with a second width that is greater than the first width, the first wide width portion being disposed in a vicinity of one of the plurality of spacers,
the first wide width portion is asymmetric with respect to a center line of the first source wiring line when seen in a normal line direction of the main surface of the substrate, and
a part of the first wide width portion overlaps with a spacer shadow region extending from the one spacer to a side of the first direction with an identical width with a width of the one spacer.

20. The active matrix substrate according to claim 19, wherein the center line of the first source wiring line extends across the spacer shadow region and a part of the spacer shadow region located on a first side of the center line is greater than a part located on a second side when seen in the normal line direction of the main surface of the substrate, and
a part of the first wide width portion located on the first side of the center line is greater than a part located on the second side when seen in the normal line direction of the main surface of the substrate.

* * * * *